(12) United States Patent
Tomotani

(10) Patent No.: US 7,786,566 B2
(45) Date of Patent: Aug. 31, 2010

(54) SEMICONDUCTOR INTEGRATED CIRCUIT

(75) Inventor: Hiroshi Tomotani, Osaka (JP)

(73) Assignee: Panasonic Corporation, Osaka (JP)

( * ) Notice: Subject to any disclaimer, the term of this patent is extended or adjusted under 35 U.S.C. 154(b) by 447 days.

(21) Appl. No.: 11/905,528

(22) Filed: Oct. 2, 2007

(65) Prior Publication Data

US 2008/0079026 A1    Apr. 3, 2008

(30) Foreign Application Priority Data

Oct. 3, 2006    (JP) .............................. 2006-272218

(51) Int. Cl.
*G06F 17/50* (2006.01)
*H01L 23/52* (2006.01)
(52) U.S. Cl. ............................ 257/691; 716/12; 716/16
(58) Field of Classification Search ................ 257/691, 257/E27.105; 716/12–14, 16–17
See application file for complete search history.

(56) References Cited

U.S. PATENT DOCUMENTS

| | | | | |
|---|---|---|---|---|
| 3,611,317 | A * | 10/1971 | Bonfeld ........................ | 257/691 |
| 4,523,106 | A * | 6/1985 | Tanizawa et al. ............... | 326/41 |
| 4,701,860 | A * | 10/1987 | Mader .......................... | 716/12 |
| 4,811,073 | A * | 3/1989 | Kitamura et al. .............. | 257/203 |
| 5,311,058 | A * | 5/1994 | Smolley ....................... | 257/691 |
| 5,315,130 | A * | 5/1994 | Hively et al. .................. | 257/48 |
| 5,442,206 | A * | 8/1995 | Ienaga et al. .................. | 257/207 |
| 6,121,681 | A * | 9/2000 | Tanaka et al. ................. | 257/723 |
| 6,256,604 | B1 * | 7/2001 | Yabe et al. .................... | 703/14 |
| 6,339,235 | B1 * | 1/2002 | Takata ......................... | 257/208 |
| 6,367,061 | B1 * | 4/2002 | Kurokawa et al. ............. | 716/10 |
| 6,504,187 | B1 | 1/2003 | Furuichi | |
| 6,550,049 | B1 * | 4/2003 | Torii ........................... | 716/13 |
| 6,657,307 | B2 * | 12/2003 | Iwamoto ....................... | 257/773 |
| 6,711,727 | B1 * | 3/2004 | Teig et al. ..................... | 716/12 |
| 6,770,963 | B1 * | 8/2004 | Wu ............................ | 257/691 |
| 6,960,793 | B2 * | 11/2005 | Ushiyama .................... | 257/207 |
| 7,086,022 | B2 * | 8/2006 | Kurimoto ...................... | 716/6 |
| 7,155,684 | B2 * | 12/2006 | Kusumoto ..................... | 716/1 |
| 7,543,249 | B2 * | 6/2009 | Redorta et al. ................. | 716/1 |
| 7,602,058 | B2 * | 10/2009 | Katou ......................... | 257/691 |
| 7,610,572 | B2 * | 10/2009 | Kanno et al. .................. | 716/16 |
| 2001/0011768 | A1 * | 8/2001 | Kohara et al. ............... | 257/692 |
| 2002/0113254 | A1 * | 8/2002 | Tomotani .................... | 257/211 |
| 2002/0149116 | A1 * | 10/2002 | Kusumoto ................. | 257/777 |

(Continued)

OTHER PUBLICATIONS

"System LSI Design, LSI Design, Lecture Material", System on a Chip Design Technology, Semiconductor Academic Research Center, Endowed Chair in 2002, Waseda University, Chapter 6, Layout Design 2, p. 36 and a Partial English Translation.

*Primary Examiner*—Stacy A Whitmore
(74) *Attorney, Agent, or Firm*—McDermott Will & Emery LLP

(57) ABSTRACT

A semiconductor integrated circuit includes: a macro cell having a plurality of circuit elements; a first macro cell power supply line for supplying a first potential to the macro cell; and a second macro cell power supply line formed in a same wiring layer as a wiring layer of the first macro cell power supply line, for supplying a second potential to the macro cell. The first and second macro cell power supply lines are provided on the macro cell. The second macro cell power supply line extends in a first direction that is a longitudinal direction of the first macro cell power supply line.

31 Claims, 15 Drawing Sheets

U.S. PATENT DOCUMENTS

| | | | |
|---|---|---|---|
| 2003/0001171 A1* | 1/2003 | Banno et al. | 257/207 |
| 2003/0030073 A1* | 2/2003 | Saotome et al. | 257/202 |
| 2003/0116787 A1* | 6/2003 | Kurimoto | 257/200 |
| 2003/0177464 A1* | 9/2003 | Takechi et al. | 716/10 |
| 2004/0006754 A1* | 1/2004 | Sonohara | 716/8 |
| 2004/0206985 A1* | 10/2004 | Ushiyama | 257/207 |
| 2004/0238939 A1* | 12/2004 | Wu | 257/691 |
| 2004/0251535 A1* | 12/2004 | Nagata et al. | 257/691 |
| 2006/0151810 A1* | 7/2006 | Ohshige | 257/207 |
| 2006/0175637 A1* | 8/2006 | Lee | 257/207 |
| 2006/0189041 A1* | 8/2006 | Mizuno et al. | 438/129 |
| 2007/0029661 A1* | 2/2007 | Beddingfield et al. | 257/691 |
| 2007/0200218 A1* | 8/2007 | Mukaibara | 257/691 |
| 2008/0073673 A1* | 3/2008 | Shiga | 257/211 |
| 2008/0258177 A1* | 10/2008 | Ikeda et al. | 257/207 |

* cited by examiner

SEMICONDUCTOR INTEGRATED CIRCUIT

CROSS REFERENCE TO RELATED APPLICATION

This application claims priority under 35 U.S.C. §119 on Patent Application No. 2006-272218 filed in Japan on Oct. 3, 2006, the entire contents of which are hereby incorporated by reference.

BACKGROUND OF THE INVENTION

The invention relates to a semiconductor integrated circuit for supplying a plurality of potentials to macro cells.

With reduction in dimensions of devices, more and more elements tend to be mounted on a semiconductor chip. The overall functionality of a system is implemented by providing on a semiconductor chip a multiplicity of macro cells each having a plurality of elements such as logic elements, memory elements, and analog elements in a prescribed region.

An external terminal or an internal power supply circuit of the chip is used to supply power to these macro cells. In order to evenly apply a power supply current to the multiplicity of macro cells, power supply lines are provided all over the chip by using upper layer lines and power is supplied from the power supply lines to the macro cells.

In a conventional semiconductor integrated circuit, macro cell power supply lines are provided in a ring shape in the outer periphery of the macro cells so that the macro cell power supply lines can be easily connected to chip-level power supply lines extending in the horizontal and vertical directions of the macro cells (e.g., see "System LSI Design, LSI Design, Lecture Material," SoC (System on a Chip) Design Technology, STARC (Semiconductor Technology Academic Research Center) Endowed Chair in 2002, Waseda University, Chapter 6, Layout Design 2, p. 34). In recent semiconductor integrated circuits having multiple semiconductor wiring layers, macro cell power supply lines are arranged in stripes on the macro cells.

FIG. 16 is a block diagram showing the structure of power supply lines of a conventional semiconductor integrated circuit. A macro cell 100 of FIG. 16 includes a plurality of logic elements and is formed in fourth and lower wiring layers. Macro cell outer peripheral power supply lines 110, 111, 120, and 121 are arranged in a ring shape in the outer periphery of the macro cell 100.

The macro cell outer peripheral power supply lines 110 extend in the vertical direction and supply a potential level VDD to the macro cell 100. The macro cell outer peripheral power supply lines 111 extend in the vertical direction and supply a potential level VSS to the macro cell 100. The macro cell outer peripheral power supply lines 120 extend in the horizontal direction and supply a potential level VDD to the macro cell 100. The macro cell outer peripheral power supply lines 121 extend in the horizontal direction and supply a potential level VSS to the macro cell 100.

The macro cell outer peripheral power supply lines 110, 111 are formed in a fourth wiring layer. The macro cell outer peripheral power supply lines 120, 121 are formed in a third wiring layer. The macro cell outer peripheral power supply lines 110, 120 are connected to each other through contacts formed at the intersections of the macro cell outer peripheral power supply lines 110, 120. Similarly, the macro cell outer peripheral power supply lines 111, 121 are connected to each other through contacts formed at the intersections of the macro cell outer peripheral power supply lines 111, 121.

The macro cell 100 receives a potential level VDD and a potential level VSS by connecting the macro cell outer peripheral power supply lines 110, 111, 120, and 121 with macro cell internal power supply lines that extend in the vertical or horizontal direction. The macro cell outer peripheral power supply lines 110, 111, 120, and 121 have such a wiring width that the macro cell outer peripheral power supply lines 110, 111, 120, and 121 can supply a current that is consumed in the macro cell 100.

Chip-level power supply lines 130, 131, 140, and 141 are formed in a fifth or higher wiring layer that is located higher than the layers of the macro cell 100 and the macro cell outer peripheral power supply lines 110, 111, 120, and 121. The chip-level power supply lines 130, 131 extend in the horizontal or vertical direction and supply a potential level VDD to the macro cell outer peripheral power supply lines 110 or 120. The chip-level power supply lines 140, 141 extend in the horizontal or vertical direction and supply a potential level VSS to the macro cell outer peripheral power supply lines 111 or 121.

Macro cell outer peripheral power supply lines need to have a wiring width equal to or larger than a wiring width corresponding to a current that is consumed in a macro cell. Even a macro cell having a small area needs a large current in the case where a wiring capacitance of an output is large and the macro cell has an output buffer having large driving capability, in the case of high speed operation, and the like. In these cases, the macro cell outer peripheral power supply lines have a large wiring width. Therefore, even when the area of the macro cell itself is small, the overall area including the power supply lines becomes large.

As described above, a conventional semiconductor integrated circuit has macro cell outer peripheral power supply lines in the outer periphery of each macro cell. Therefore, when a large current need to be supplied to a macro cell, the overall area of the macro cell including the power supply lines is increased and the area of the semiconductor integrated circuit is increased accordingly.

Especially in resent semiconductor integrated circuits, reduction in wiring dimensions has caused an increase in line-to-line capacitance and wiring resistance, and an operating frequency of the circuits has been increasing. Therefore, the wiring width of the macro cell outer peripheral power supply lines need to be increased in order to supply a required power supply current to the macro cells.

Moreover, lead-in wirings from the macro cell outer peripheral power supply lines to the macro cells are also required. Such lead-in wirings need to be provided in consideration of factors such as a lead-in wiring resistance, a via connection resistance, an allowable current amount for assuring reliability, and an IR (current-resistance) drop. Therefore, the number of lead-in wirings, the lead-in wiring width, and the number of connection vias need to be increased.

Power supply lines for supplying a substrate potential are also required for circuit elements for controlling a substrate potential. However, connection between such circuit elements and chip-level substrate power supply lines has been getting difficult.

SUMMARY OF THE INVENTION

It is an object of the invention to suppress the area of a semiconductor integrated circuit having a macro cell.

A semiconductor integrated circuit according to the invention has a macro cell, and supplies potentials from power supply lines provided on the macro cell to the macro cell. Therefore, power supply lines need not be provided in the outer periphery of the macro cell, and no lead-in wirings from macro cell outer peripheral power supply lines to the macro cell are required. Moreover, since connection between chip-level power supply lines and macro cell power supply lines can be assured, factors such as a lead-in wiring resistance, a via connection resistance, an allowable current amount for assuring reliability, and an IR drop need not be considered.

More specifically, a semiconductor integrated circuit according to the invention includes: a macro cell having a plurality of circuit elements; a first macro cell power supply line for supplying a first potential to the macro cell; and a second macro cell power supply line formed in a same wiring layer as a wiring layer of the first macro cell power supply line, for supplying a second potential to the macro cell. The first and second macro cell power supply lines are provided on the macro cell. The second macro cell power supply line extends in a first direction that is a longitudinal direction of the first macro cell power supply line.

In this semiconductor integrated circuit, the first and second macro cell power supply lines for supplying different potentials are provided on the macro cell. Therefore, the macro cell power supply lines can be easily connected to chip-level power supply lines.

According to the invention, a plurality of power supply lines for supplying different potentials are provided on the macro cell. Therefore, the power supply lines can be easily connected to chip-level power supply lines, eliminating the need to provide power supply lines in the outer periphery of the macro cell. As a result, the area of the semiconductor integrated circuit can be suppressed.

DETAILED DESCRIPTION OF THE PREFERRED EMBODIMENTS

Hereinafter, embodiments of the invention will be described with reference to the accompanying drawings.

Figure 1:
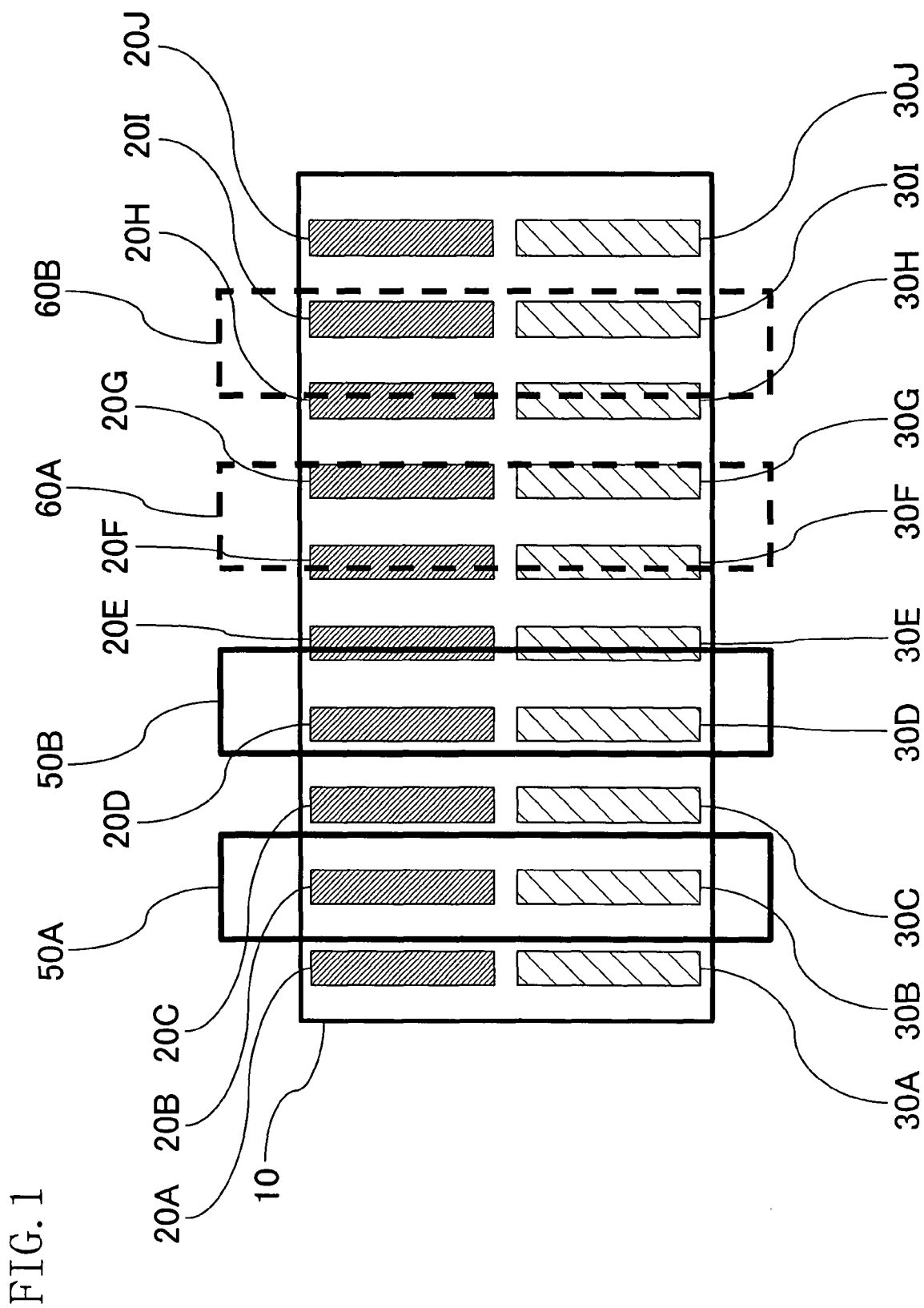
FIG. 1 is a block diagram showing the structure of power supply lines of a semiconductor integrated circuit according to an embodiment of the invention.

FIG. 1 is a block diagram showing the structure of power supply lines of a semiconductor integrated circuit according to an embodiment of the invention. The semiconductor integrated circuit of FIG. 1 has a macro cell 10 having a plurality of circuit elements. The semiconductor integrated circuit of FIG. 1 has first macro cell power supply lines 20A through 20J and second macro cell power supply lines 30A through 30J on the macro cell 10. The first macro cell power supply lines 20A through 20J supply a power supply potential, a VDD potential (a first potential), to the macro cell 10 and the second macro cell power supply lines 30A through 30J supply a ground potential, a VSS potential (a second potential), to the macro cell 10.

The first macro cell power supply lines 20A through 20J and the second macro cell power supply lines 30A through 30J are formed in a fourth wiring layer that is the uppermost wiring layer used in the macro cell 10. The first macro cell power supply lines 20A through 20J extend in the vertical direction and are arranged next to each other in the horizontal direction. Similarly, the second macro cell power supply lines 30A through 30J extend in the vertical direction and are arranged next to each other in the horizontal direction. The second macro cell power supply lines 30A through 30J correspond to the first macro cell power supply lines 20A through 20J, respectively. Each of the second macro cell power supply lines 30A through 30J is located next to a corresponding first macro cell power supply line in the longitudinal direction of the first macro cell power supply line (that is, in the extending direction of the first macro cell power supply line; in the vertical direction in FIG. 1).

First chip-level power supply lines 50A, 50B and second chip-level power supply lines 60A, 60B are formed over the macro cell 10 (hereinafter, the first chip-level power supply lines and the second chip-level power supply lines are referred to as first upper layer power supply lines and second upper layer power supply lines, respectively). The first upper layer power supply lines 50A, 50B and the second upper layer power supply lines 60A, 60B are formed in a fifth wiring layer that is located higher than the wiring layer of the first macro cell power supply lines 20A through 20J and the second macro cell power supply lines 30A through 30J. The first upper layer power supply lines 50A, 50B and the second upper layer power supply lines 60A, 60B extend in parallel with the first macro cell power supply lines 20A through 20J and the second macro cell power supply lines 30A through 30J.

The first upper layer power supply lines 50A and 50B supply a VDD potential to the first macro cell power supply lines 20A through 20J. A contact is formed at positions where the first upper layer power supply lines 50A, 50B overlap the first macro cell power supply lines 20A through 20J. Of the first macro cell power supply lines 20A through 20J, those which overlap the first upper layer power supply line 50A or 50B are connected to the first upper layer power supply line 50A or 50B through a corresponding contact.

The second upper layer power supply lines 60A and 60B supply a VSS potential to the second macro cell power supply lines 30A through 30J. A contact is formed at positions where the second upper layer power supply lines 60A, 60B overlap the second macro cell power supply lines 30A through 30J. Of the second macro cell power supply lines 30A through 30J, those which overlap the second upper layer power supply line 60A or 60B are connected to the second upper layer power supply line 60A or 60B through a corresponding contact.

As described above, the second macro cell power supply lines 30A through 30J extend in the longitudinal direction (the extending direction) of the corresponding first macro cell power supply lines 20A through 20J, respectively. Therefore, the upper layer power supply lines can be easily connected to the macro cell power supply lines regardless of whether the first upper layer power supply lines 50A, 50B and the second upper layer power supply lines 60A, 60B extend in parallel with the first macro cell power supply lines 20A through 20J and the second macro cell power supply lines 30A through 30J or extend perpendicularly to the first macro cell power supply lines 20A through 20J and the second macro cell power supply lines 30A through 30J. Accordingly, no macro cell outer peripheral power supply line need to be provided in the outer periphery of the macro cell 10, whereby the area of the semiconductor integrated circuit can be suppressed.

Moreover, connection can be made at every place where the first upper layer power supply lines 50A, 50B overlap the first macro cell power supply lines 20A through 20J and at every place where the second upper layer power supply lines 60A, 60B overlap the second macro cell power supply lines 30A through 30J. Therefore, a large current can be supplied to the macro cell 10.

The semiconductor integrated circuit of FIG. 1 has a plurality of first macro cell power supply lines and a plurality of second macro cell power supply lines. However, the semiconductor integrated circuit of the invention may have one or more first macro cell power supply lines and one or more second macro cell power supply lines.

The first upper layer power supply lines 50A, 50B and the second upper layer power supply lines 60A, 60B may be placed by an automatic place and route tool or the like so as to extend in the horizontal or vertical direction with a specific wiring width and at a specific wiring pitch.

A contact may be automatically placed by an automatic place and route tool or the like at the positions where the first upper layer power supply lines 50A, 50B overlap the first macro cell power supply lines 20A through 20J and at the positions where the second upper layer power supply lines 60A, 60B overlap the second macro cell power supply lines 30A through 30J. A contact need not be placed at every overlapping position.

Manual placement and routing may be performed at a location where automatic placement and routing cannot be performed.

Respective wiring widths of the first upper layer power supply lines 50A, 50B and the second upper layer power supply lines 60A, 60B may be larger or smaller than respective wiring widths of the first macro cell power supply lines 20A through 20J and the second macro cell power supply lines 30A through 30J.

The wiring pitch of the first upper layer power supply lines 50A, 50B and the wiring pitch of the second upper layer power supply lines 60A, 60B may be larger or smaller than the wiring pitch of the first macro cell power supply lines 20A through 20J and the wiring pitch of the second macro cell power supply lines 30A through 30J.

Respective wiring widths of the first upper layer power supply lines 50A and 50B may be larger than the wiring pitch of the first macro cell power supply lines 20A through 20J. Similarly, respective wiring widths of the second upper layer power supply lines 60A and 60B may be larger than the wiring pitch of the second macro cell power supply lines 30A through 30J.

(First Modification)

Figure 2:
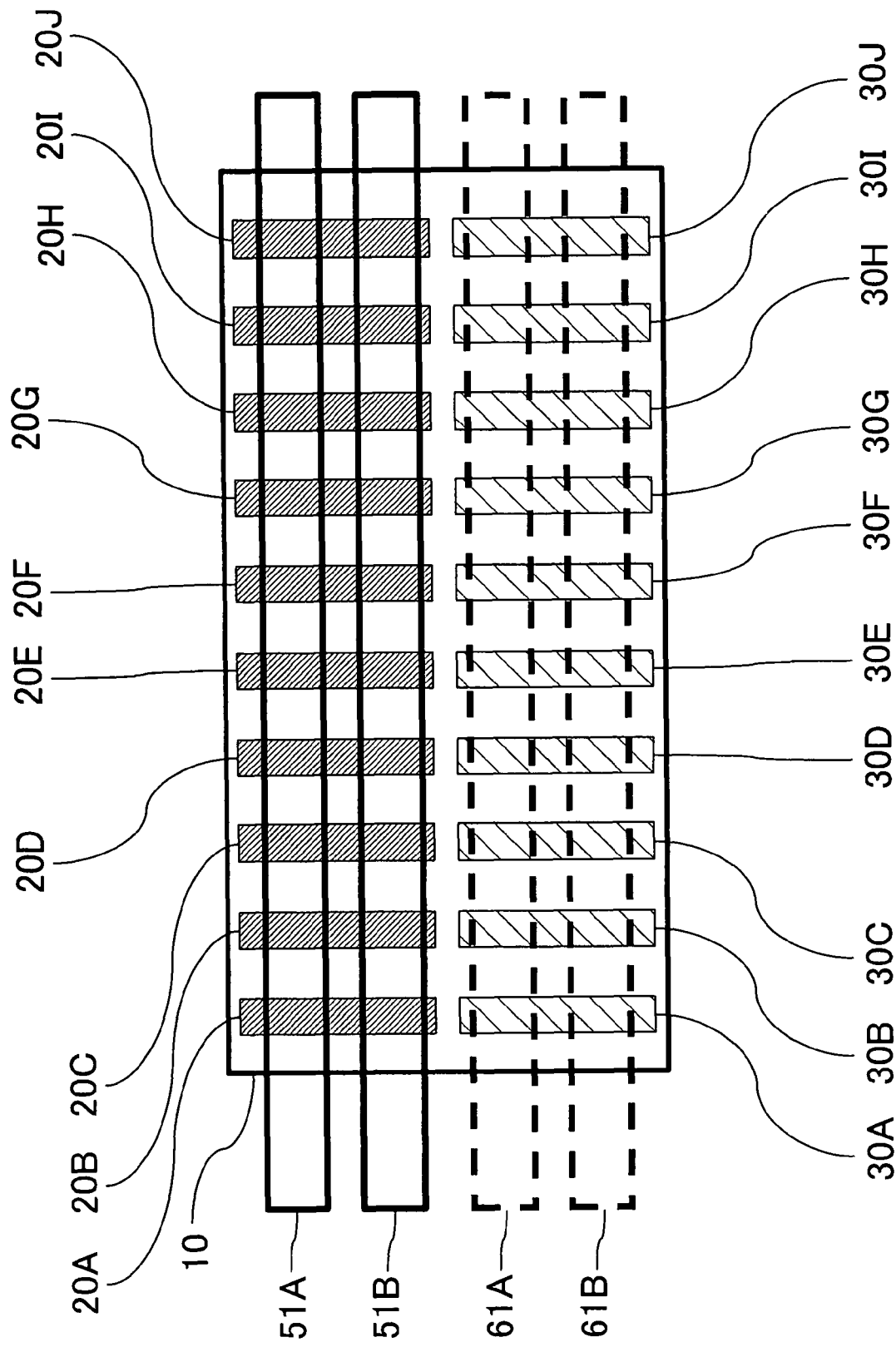
FIG. 2 is a block diagram showing the structure of power supply lines of a semiconductor integrated circuit according to a first modification of the invention.

A first modification of the power supply lines of the semiconductor integrated circuit of FIG. 1 will now be described. FIG. 2 is a block diagram showing the structure of power supply lines of a semiconductor integrated circuit of the first modification.

In FIG. 2, first macro cell power supply lines 20A through 20J and second macro cell power supply lines 30A through 30J are arranged in the same manner as that of FIG. 1. In FIG. 2, first upper layer power supply lines 51A, 51B and second upper layer power supply lines 61A, 61B are formed over the macro cell 10. The first upper layer power supply lines 51A, 51B and the second upper layer power supply lines 61A, 61B are formed in a fifth wiring layer that is located higher than the wiring layer of the first macro cell power supply lines 20A through 20J and the second macro cell power supply lines 30A through 30J. The first upper layer power supply lines 51A, 51B and the second upper layer power supply lines 61A, 61B extend in the direction perpendicular to the first macro cell power supply lines 20A through 20J and the second macro cell power supply lines 30A through 30J.

The first upper layer power supply lines 51A, 51B supply a VDD potential to the first macro cell power supply lines 20A through 20J. A contact is formed at the intersections of the first upper layer power supply lines 51A, 51B and the first macro cell power supply lines 20A through 20J. The second upper layer power supply lines 61A, 61B supply a VSS potential to the second macro cell power supply lines 30A through 30J. A contact is formed at the intersections of the second upper layer power supply lines 61A, 61B and the second macro cell power supply lines 30A through 30J. As in the structure of FIG. 1, each of the first macro cell power supply lines 20A through 20J which crosses the first upper layer power supply line 51A or 51B is connected to the first power supply line 51A or 51B through a corresponding contact. Similarly, each of the second macro cell power supply lines 30A through 30J which crosses the second upper layer power supply line 61A or 61B is connected to the second power supply line 61A or 61B through a corresponding contact.

(Second Modification)

Figure 3:
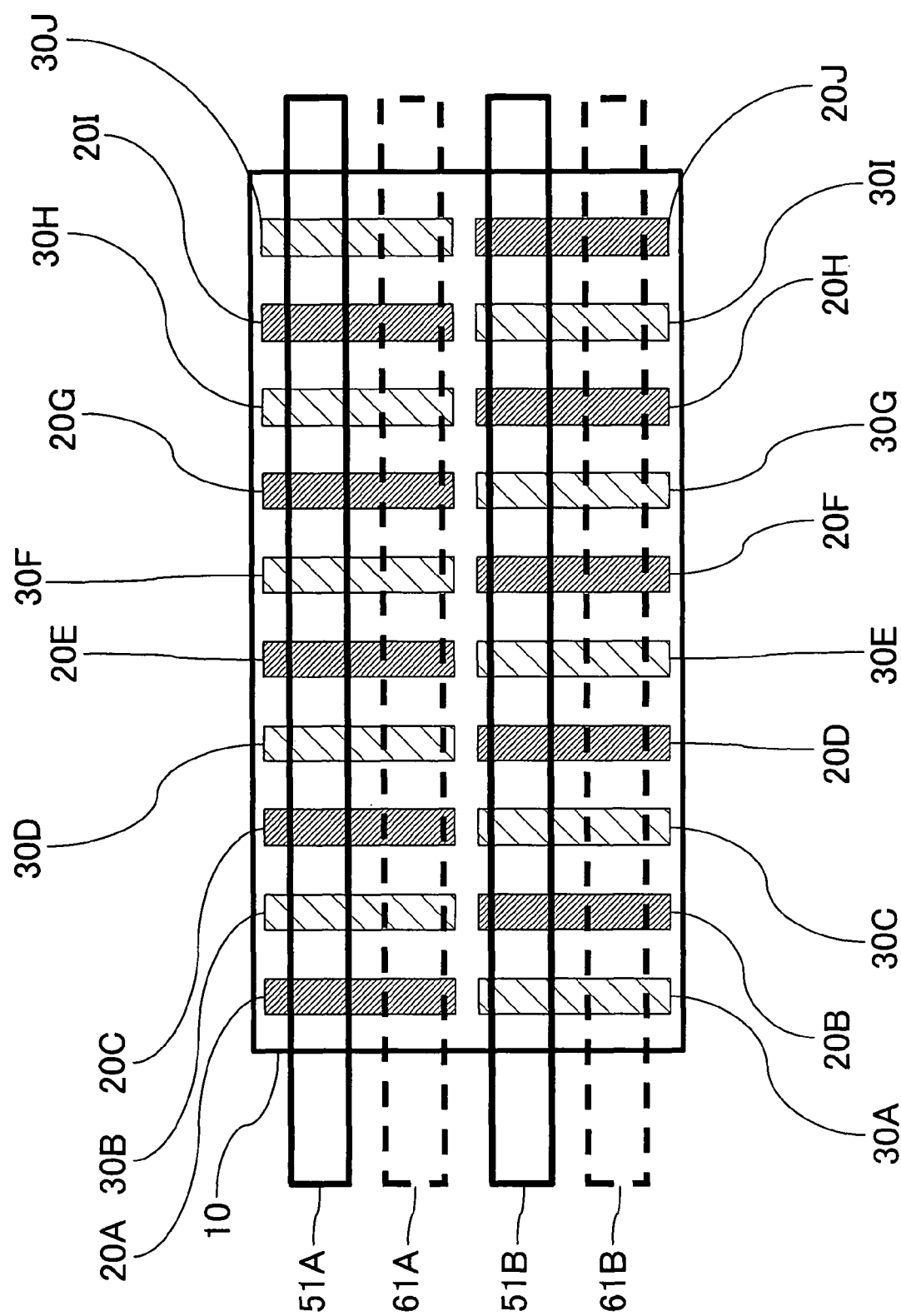
FIG. 3 is a block diagram showing the structure of power supply lines of a semiconductor integrated circuit according to a second modification of the invention.

A second modification of the power supply lines of the semiconductor integrated circuit of FIG. 1 will now be described. FIG. 3 is a block diagram showing the structure of power supply lines of a semiconductor integrated circuit of the second modification.

The structure of FIG. 3 is the same as that of FIG. 1 in that the second macro cell power supply lines 30A through 30J of FIG. 1 extend in the longitudinal direction of the corresponding first macro cell power supply lines 20A through 20J of FIG. 1, respectively.

However, the structure of FIG. 3 is different from that of FIG. 1 in that the first macro cell power supply lines 20A through 20J and the second macro cell power supply lines 30A through 30J are arranged in a checkered pattern.

More specifically, the first macro cell power supply line 20A, the second macro cell power supply line 30B, the first macro cell power supply line 20C, the second macro cell power supply line 30D, the first macro cell power supply line 20E, the second macro cell power supply line 30F, the first macro cell power supply line 20G, the second macro cell power supply line 30H, the first macro cell power supply line 20I, and the second macro cell power supply line 30J are arranged next to each other in the horizontal direction in this order.

Similarly, the second macro cell power supply line 30A, the first macro cell power supply line 20B, the second macro cell power supply line 30C, the first macro cell power supply line 20D, the second macro cell power supply line 30E, the first macro cell power supply line 20F, the second macro cell power supply line 30G, the first macro cell power supply line 20H, the second macro cell power supply line 30I, and the first macro cell power supply line 20J are arranged next to each other in the horizontal direction in this order.

The structure of FIG. 3 is the same as that of FIG. 2 in that the first upper layer power supply lines 51A, 51B and the second upper layer power supply lines 61A, 61B are formed over the macro cell 10, in that the first upper layer power supply lines 51A, 51B and the second upper layer power supply lines 61A, 61B are formed in a fifth wiring layer that is located higher than the wiring layer of the first macro cell power supply lines 20A through 20J and the second macro cell power supply lines 30A through 30J, and in that the first upper layer power supply lines 51A, 51B and the second upper layer power supply lines 61A, 61B extend in the direction perpendicular to the first macro cell power supply lines 20A through 20J and the second macro cell power supply lines 30A through 30J.

However, the structure of FIG. 3 is different from that of FIG. 2 in that the respective positions of the first upper layer power supply line 51B and the second upper layer power supply line 61A are switched in FIG. 3 with respect to FIG. 2 so that the second upper layer power supply line 61A supplies a VSS potential to the second macro cell power supply lines 30B, 30D, 30F, 30H, and 30J and the first upper layer power supply line 51B supplies a VDD potential to the first macro cell power supply lines 20B, 20D, 20F, 20H, and 20J.

(Third Modification)

Figure 4:
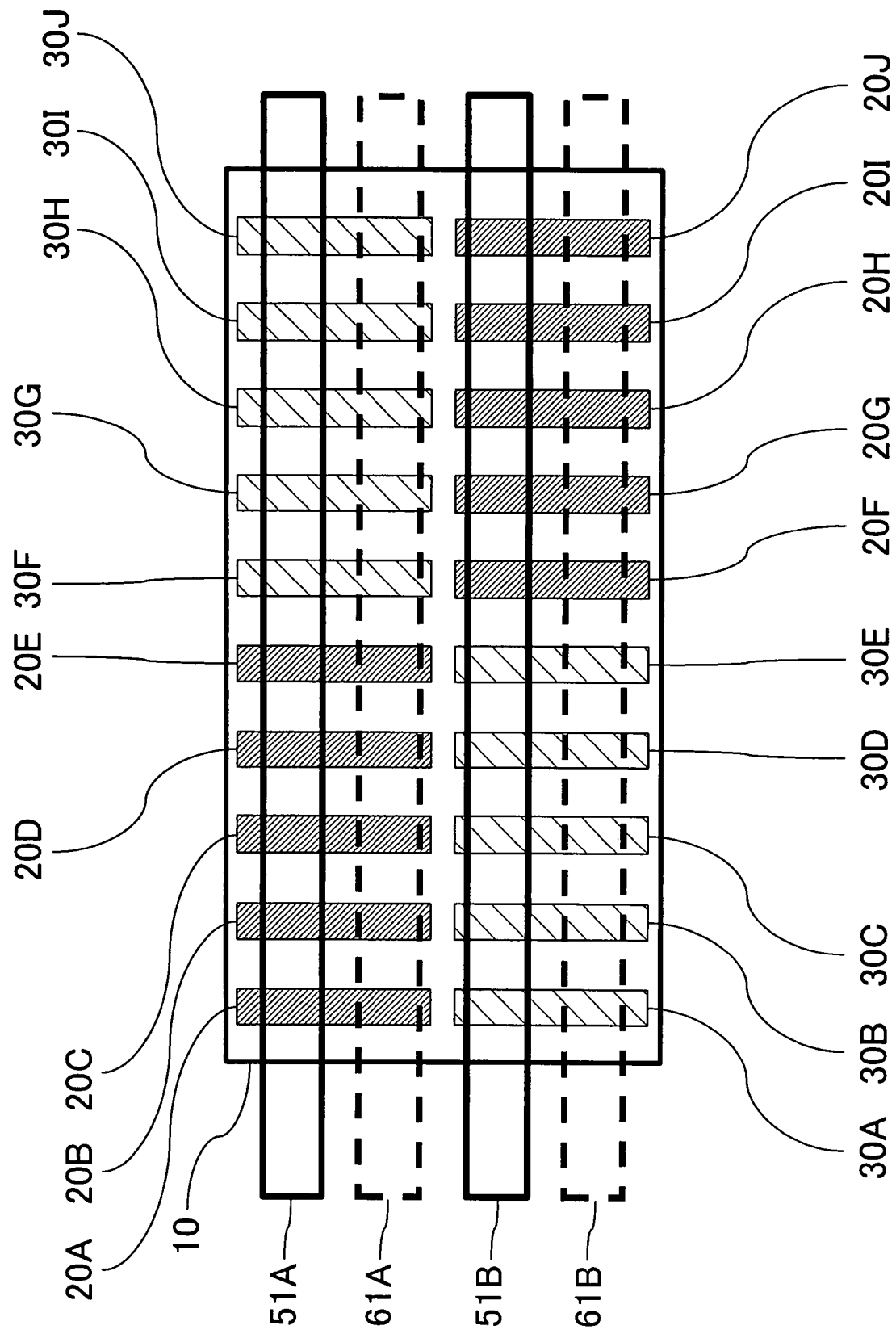
FIG. 4 is a block diagram showing the structure of power supply lines of a semiconductor integrated circuit according to a third modification of the invention.

A third modification of the power supply lines of the semiconductor integrated circuit of FIG. 1 will now be described. FIG. 4 is a block diagram showing the structure of power supply lines of a semiconductor integrated circuit of the third modification.

The structure of FIG. 4 is the same as that of FIG. 1 in that the second macro cell power supply lines 30A through 30J of FIG. 1 extend in the longitudinal direction of the corresponding first macro cell power supply lines 20A through 20J, respectively.

However, the structure of FIG. 4 is different from that of FIG. 1 in that the first macro cell power supply lines 20A through 20E and the second macro cell power supply lines 30F through 30J are arranged next to each other in the horizontal direction and in that the second macro cell power supply lines 30A through 30E and the first macro cell power supply lines 20F through 20J are arranged next to each other in the horizontal direction.

In FIG. 4, the first upper layer power supply lines 51A, 51B and the second upper layer power supply lines 61A, 61B of FIG. 3 are arranged in the same manner as that of FIG. 3.

(Fourth Modification)

Figure 5:
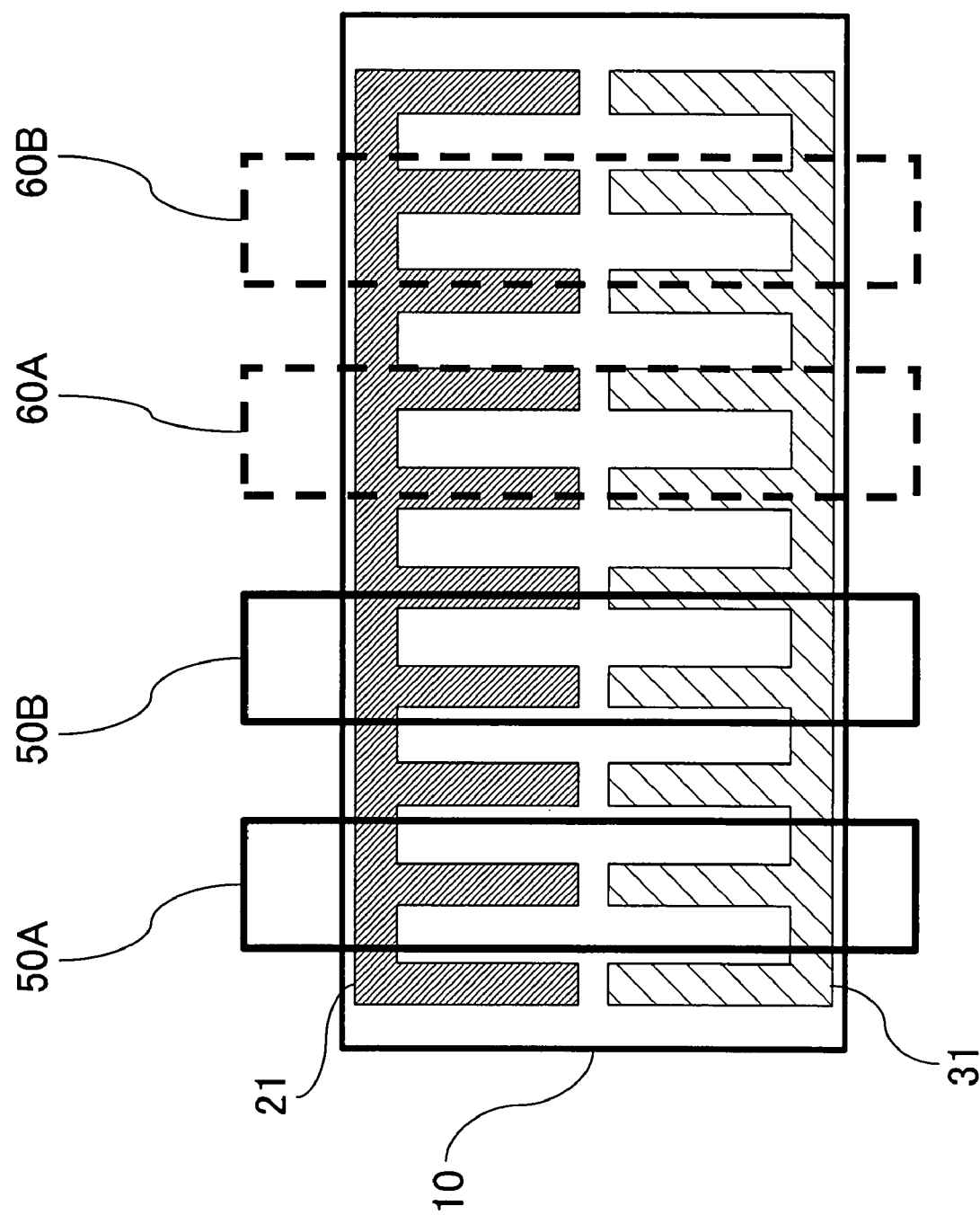
FIG. 5 is a block diagram showing the structure of power supply lines of a semiconductor integrated circuit according to a fourth modification of the invention.

A fourth modification of the power supply lines of the semiconductor integrated circuit of FIG. 1 will now be described. FIG. 5 is a block diagram showing the structure of power supply lines of a semiconductor integrated circuit of the fourth modification.

The semiconductor integrated circuit of FIG. 5 has a first macro cell power supply line 21 and a second macro cell power supply line 31 on the macro cell 10. The first macro cell power supply line 21 supplies a VDD potential to the macro cell 10 and the second macro cell power supply line 31 supplies a VSS potential to the macro cell 10. The first macro cell power supply line 21 and the second macro cell power supply line 31 are formed in a fourth wiring layer that is the uppermost wiring layer used in the macro cell 10.

The first macro cell power supply line 21 is an integral, comb-shaped wiring of the first macro cell power supply lines 20A through 20J of FIG. 1 electrically connected together at their ends. Similarly, the second macro cell power supply line 32 is an integral, comb-shaped wiring of the second macro cell power supply lines 30A through 30J of FIG. 1 electrically connected together at their ends.

In FIG. 5, the first upper layer power supply lines 50A, 50B and the second upper layer power supply lines 60A, 60B of FIG. 1 are arranged in the same manner as that of FIG. 1.

(Fifth Modification)

Figure 6:
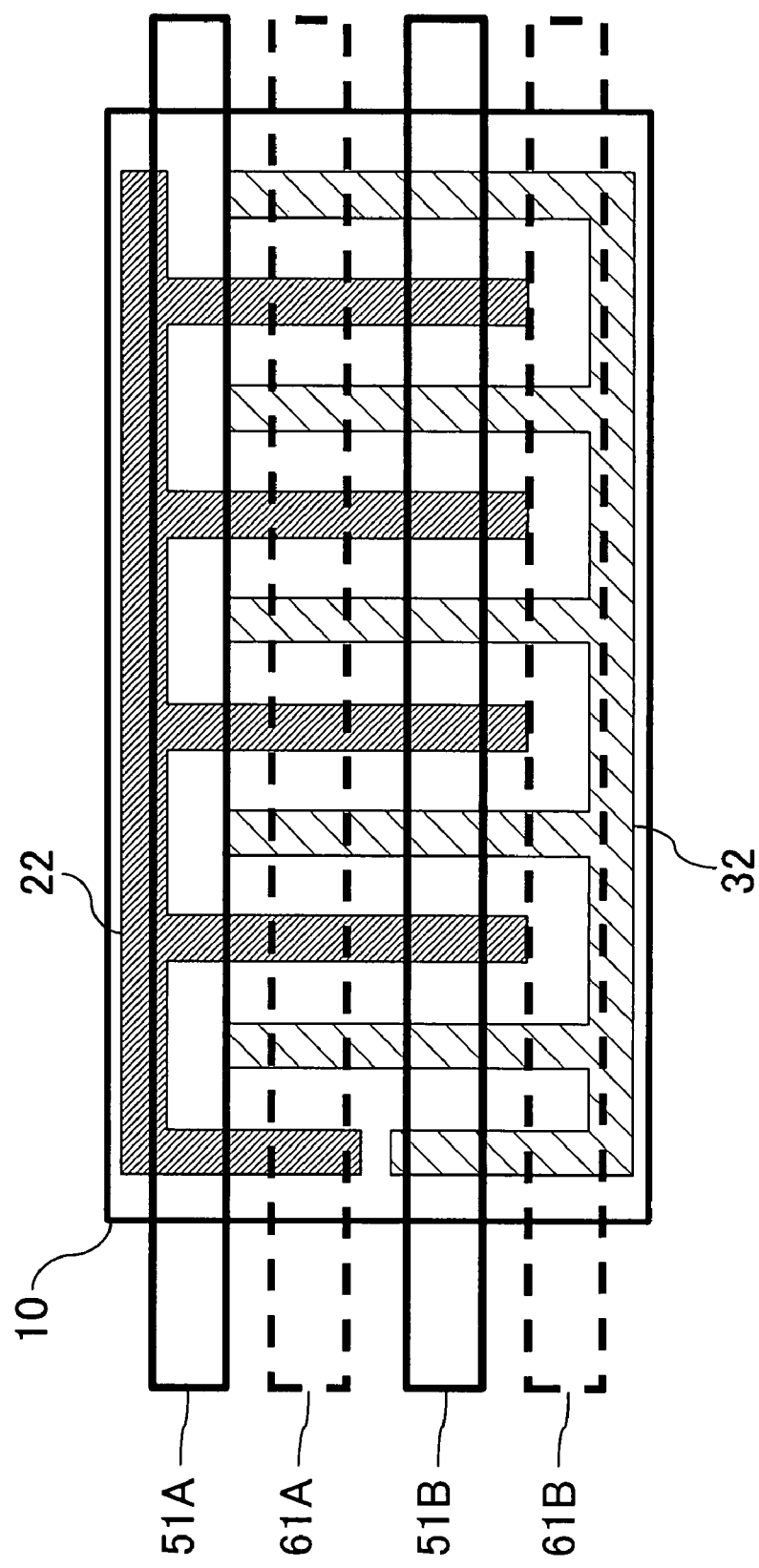
FIG. 6 is a block diagram showing the structure of power supply lines of a semiconductor integrated circuit according to a fifth modification of the invention.

A fifth modification of the power supply lines of the semiconductor integrated circuit of FIG. 1 will now be described. FIG. 6 is a block diagram showing the structure of power supply lines of a semiconductor integrated circuit of the fifth modification.

The semiconductor integrated circuit of FIG. 6 has a first macro cell power supply line 22 and a second macro cell power supply line 32 on the macro cell 10. The first macro cell power supply line 22 supplies a VDD potential to the macro cell 10 and the second macro cell power supply line 32 supplies a VSS potential to the macro cell 10. The first macro cell power supply line 22 and the second macro cell power supply line 32 are formed in a fourth wiring layer that is the uppermost wiring layer used in the macro cell 10.

Like the first macro cell power supply line 21 and the second macro cell power supply line 31 of FIG. 5, each of the first macro cell power supply line 22 and the second macro cell power supply line 32 is an integral, comb-shaped wiring, and the first macro cell power supply line 22 and the second macro cell power supply line 32 face each other.

The first macro cell power supply line 22 and the second macro cell power supply line 32 are different from the first macro cell power supply line 21 and the second macro cell power supply line 31 in that vertically extending portions of the first macro cell power supply line 21 and vertically extending portions of the second macro cell power supply line 31 are arranged alternately in FIG. 6.

In FIG. 6, the first upper layer power supply lines 51A, 51B and the second upper layer power supply lines 61A, 61B of FIG. 3 are arranged in the same manner as that of FIG. 3.

(Sixth Modification)

Figure 7:
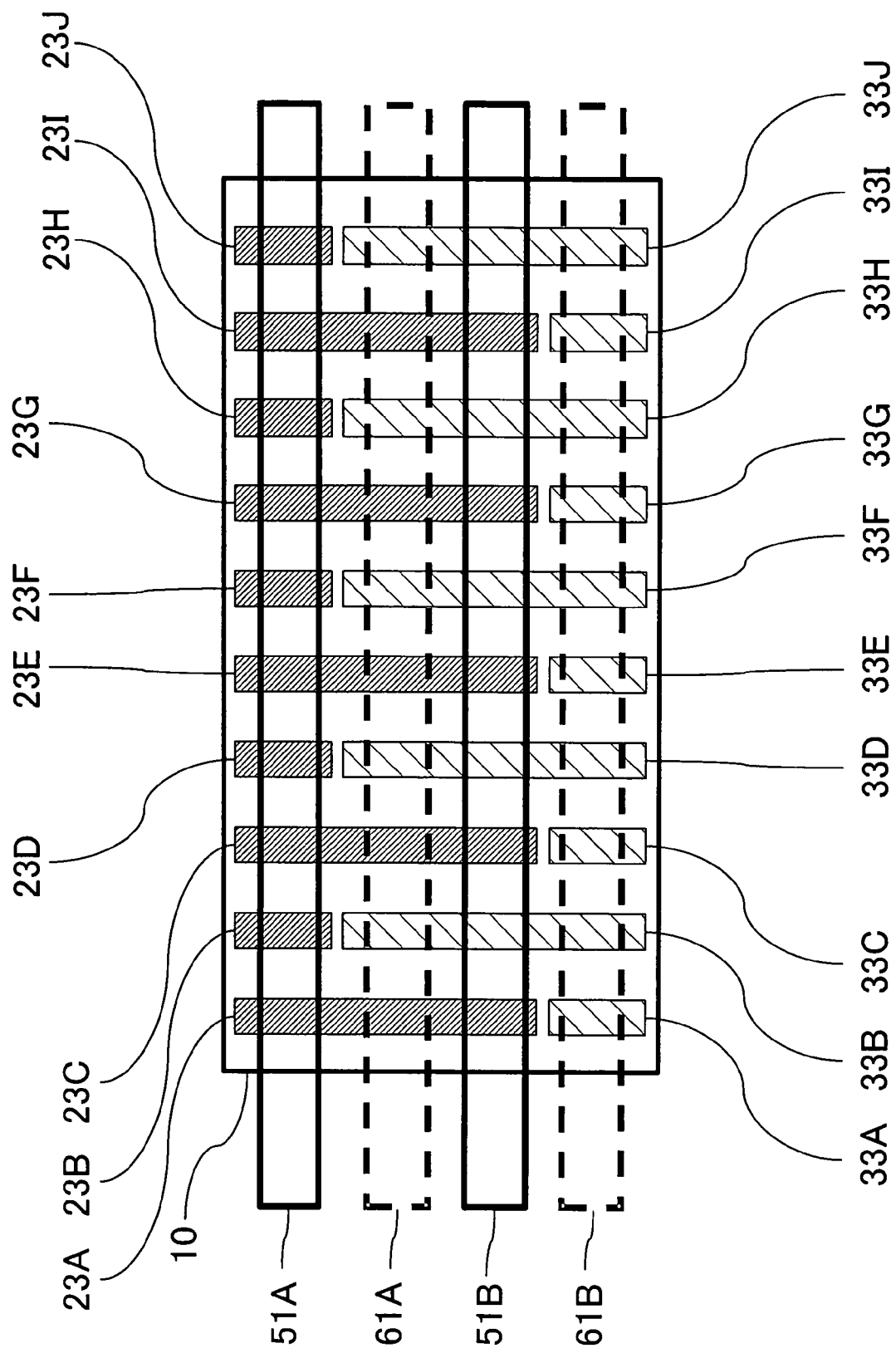
FIG. 7 is a block diagram showing the structure of power supply lines of a semiconductor integrated circuit according to a sixth modification of the invention.

A sixth modification of the power supply lines of the semiconductor integrated circuit of FIG. 1 will now be described. FIG. 7 is a block diagram showing the structure of power supply lines of a semiconductor integrated circuit of the sixth modification.

The semiconductor integrated circuit of FIG. 7 has first macro cell power supply lines 23A through 23J and second macro cell power supply lines 33A through 33J on the macro cell 10. The first macro cell power supply lines 23A through 23J have two different lengths and supply a VDD potential to the macro cell 10. The second macro cell power supply lines 33A through 33J have two different lengths and supply a VSS potential to the macro cell 10. The first macro cell power supply lines 23A through 23J and the second macro cell power supply lines 33A through 33J are formed in a fourth wiring layer that is the uppermost wiring layer used in the macro cell 10. The first macro cell power supply lines 23A through 23J and the second macro cell power supply lines 33A through 33J extend in the vertical direction.

The first macro cell power supply line 23A is longer than the first macro cell power supply line 23B. The first macro cell power supply lines 23A, 23C, 23E, 23G, and 23I and the second macro cell power supply lines 33B, 33D, 33F, 33H, and 33J have the same length. The first macro cell power supply lines 23B, 23D, 23F, 23H, and 23J and the second macro cell power supply lines 33A, 33C, 33E, 33G, and 33I have the same length.

The first macro cell power supply lines 23A through 23J are arranged next to each other in the horizontal direction in this order so that the first macro cell power supply lines of two different lengths are arranged alternately. The second macro cell power supply lines 33A through 33J are arranged next to each other in the horizontal direction in this order so that the second macro cell power supply lines of two different lengths are arranged alternately. The second macro cell power supply lines 33A through 33J correspond to the first macro cell power supply lines 23A through 23J, respectively. Each of the second macro cell power supply lines 33A through 33J is provided next to a corresponding first macro cell power supply line in the longitudinal direction of the first macro cell power supply line.

In FIG. 7, the first upper layer power supply lines 51A, 51B and the second upper layer power supply lines 61A, 61B of FIG. 3 are arranged in the same manner as that of FIG. 3.

(Seventh Modification)

Figure 8:
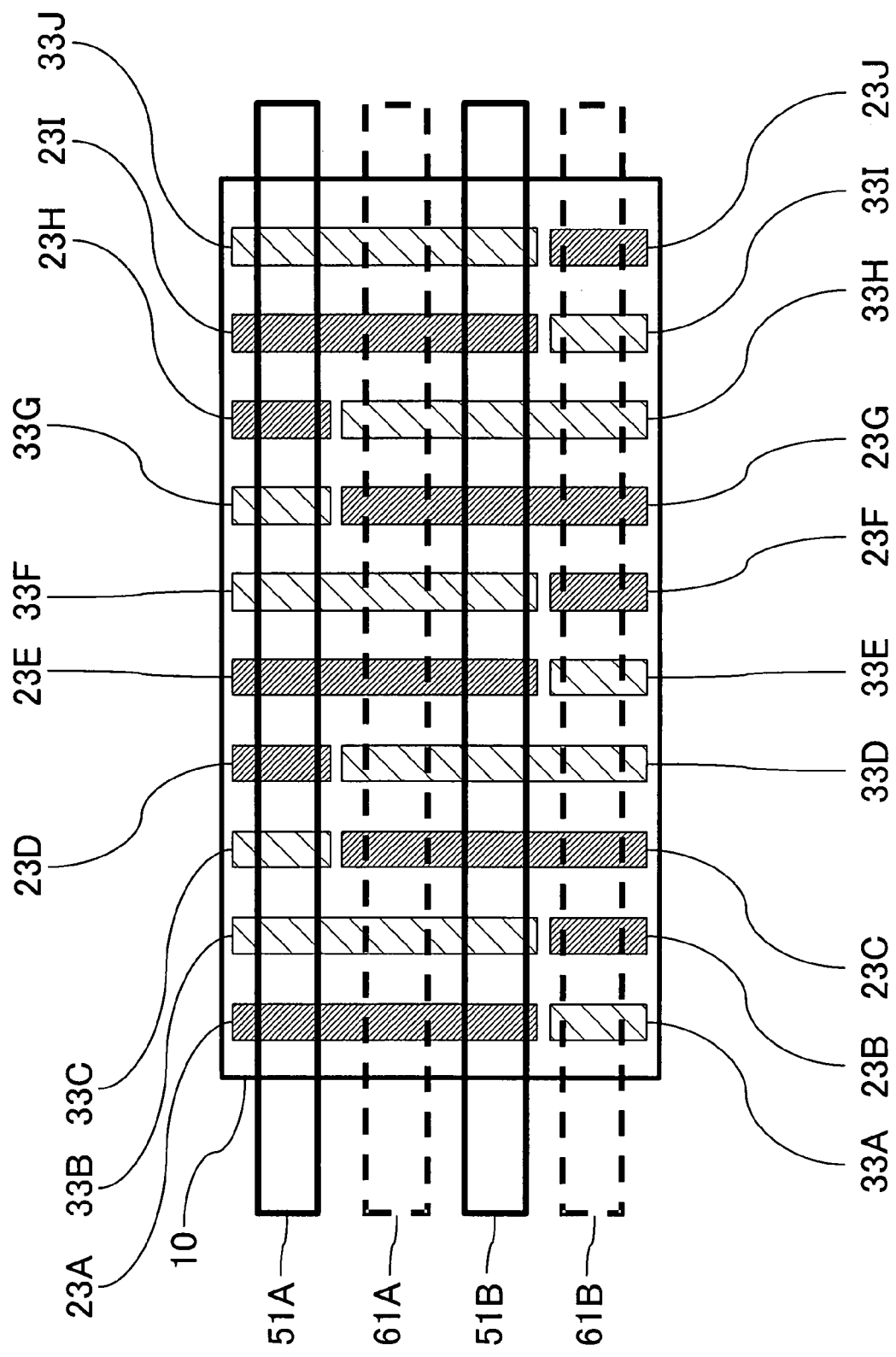
FIG. 8 is a block diagram showing the structure of power supply lines of a semiconductor integrated circuit according to a seventh modification of the invention.

A seventh modification of the power supply lines of the semiconductor integrated circuit of FIG. 1 will now be described. FIG. 8 is a block diagram showing the structure of power supply lines of a semiconductor integrated circuit of the seventh modification.

In FIG. 8, the first macro cell power supply lines 23A through 23J and the second macro cell power supply lines 33A through 33J of FIG. 7 extend in the vertical direction as in FIG. 7. However, arrangement of the first and second macro cell power supply lines in FIG. 8 is different from that in FIG. 7 in the following point:

The first macro cell power supply line 23A and the second macro cell power supply line 33B having the same length are located next to each other in the horizontal direction. Similarly, the second macro cell power supply line 33A and the first macro cell power supply line 23B having the same length are located next to each other in the horizontal direction. In other words, the first macro cell power supply lines having a longer length are located next to the corresponding second macro cell power supply lines having a longer length, respectively, in the horizontal direction. Moreover, the first macro cell power supply lines having a shorter length are located next to the corresponding second macro cell power supply lines having a shorter length, respectively, in the horizontal direction.

In FIG. 8, the first upper layer power supply lines 51A, 51B and the second upper layer power supply lines 61A, 61B of FIG. 3 are arranged in the same manner as that of FIG. 3.

(Eighth Modification)

Figure 9:
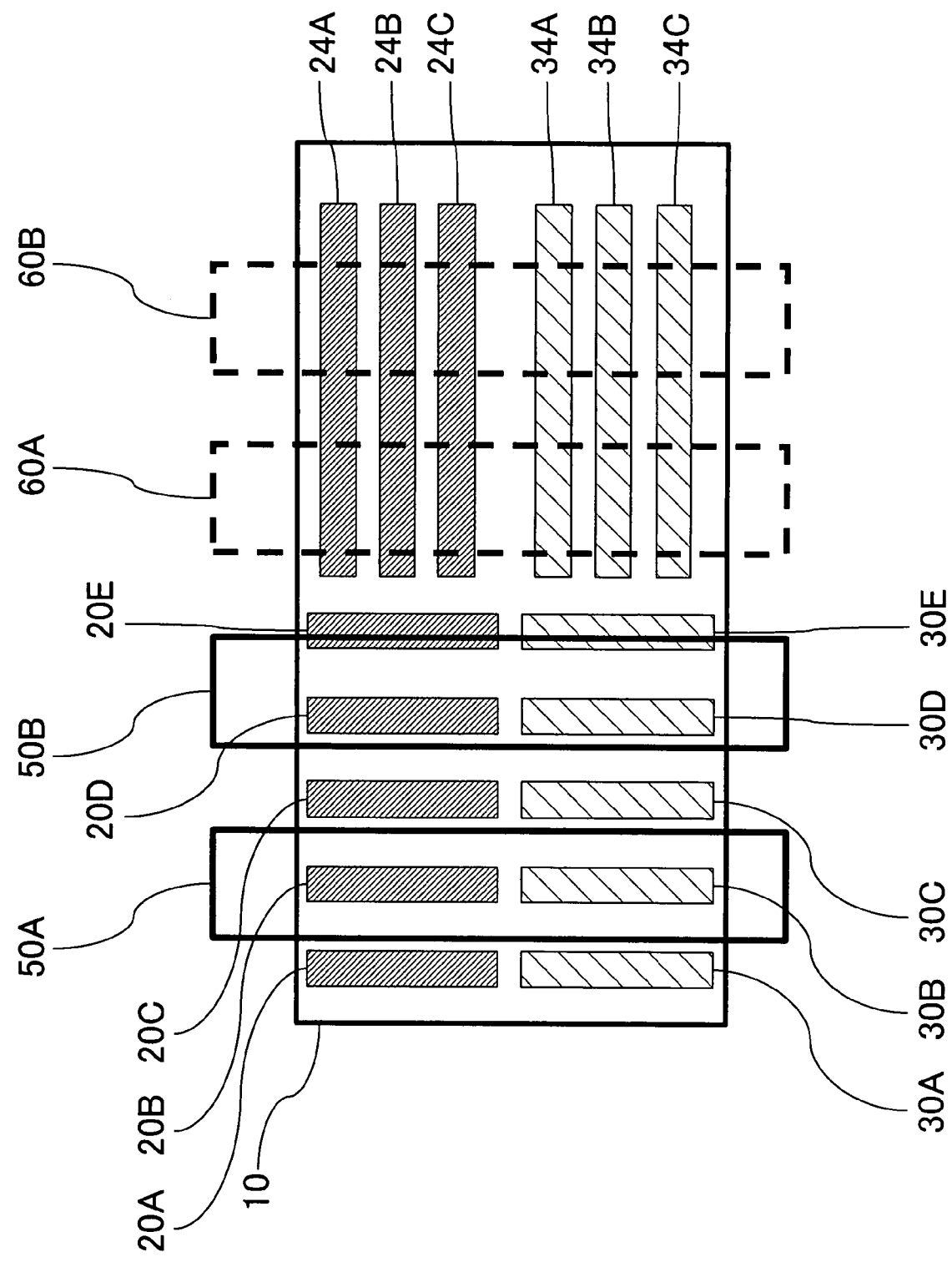
FIG. 9 is a block diagram showing the structure of power supply lines of a semiconductor integrated circuit according to an eighth modification of the invention.

An eighth modification of the power supply lines of the semiconductor integrated circuit of FIG. 1 will now be described. FIG. 9 is a block diagram showing the structure of power supply lines of a semiconductor integrated circuit of the eighth modification.

The semiconductor integrated circuit of FIG. 9 has the first macro cell power supply lines 20A through 20E of FIG. 1 and the second macro cell power supply lines 30A through 30E of FIG. 1 on the macro cell 10. The semiconductor integrated circuit of FIG. 9 further has first macro cell power supply lines 24A through 24C and second macro cell power supply lines 34A through 34C on the macro cell 10. The first macro cell power supply lines 24A through 24C supply a VDD potential to the macro cell 10 and the second macro cell power supply lines 34A through 34C supply a VSS potential to the macro cell 10.

The first macro cell power supply lines 24A through 24C and the second macro cell power supply lines 34A through 34C are formed in a fourth wiring layer that is the uppermost layer used in the macro cell 10.

In FIG. 9, the first macro cell power supply lines 20A through 20E and the second macro cell power supply lines 30A through 30E are arranged in the same manner as that of FIG. 1. The first macro cell power supply lines 24A through 24C extend in the horizontal direction so that respective extended lines of the first macro cell power supply lines 24A through 24C cross the first macro cell power supply lines 20A through 20E at right angles. The first macro cell power supply lines 24A through 24C are arranged next to each other in the vertical direction. Similarly, the second macro cell power supply lines 34A through 34C extend in the horizontal direction so that respective extended lines of the second macro cell power supply lines 34A through 34C cross the second macro cell power supply lines 30A through 30E at right angles. The second macro cell power supply lines 34A through 34C are arranged next to each other in the vertical direction.

In FIG. 9, the first upper layer power supply lines 50A, 50B and the second upper layer power supply lines 60A, 60B of FIG. 1 are arranged in the same manner as that in FIG. 1.

(Ninth Modification)

Figure 10:
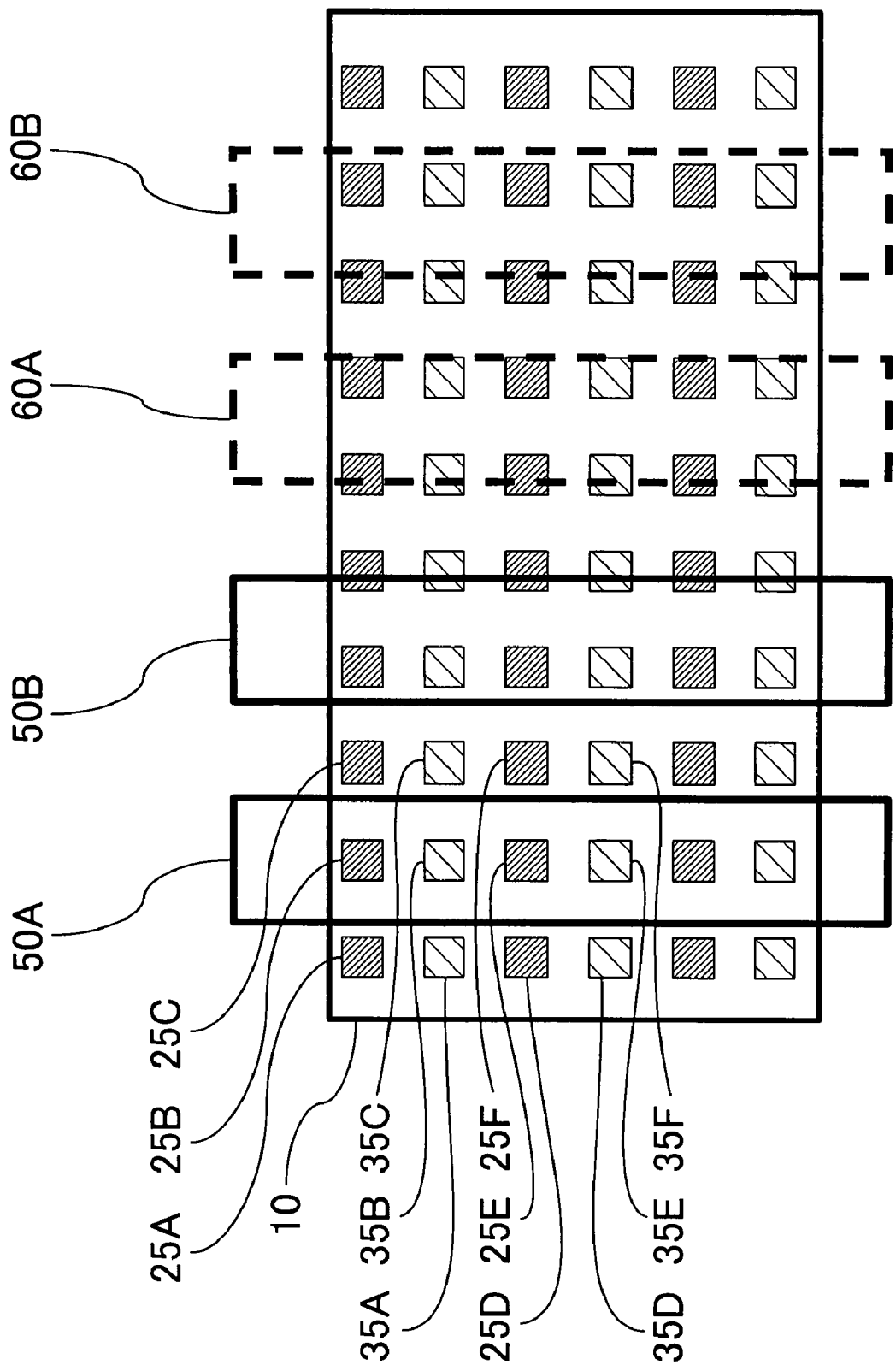
FIG. 10 is a block diagram showing the structure of power supply lines of a semiconductor integrated circuit according to a ninth modification of the invention.

A ninth modification of the power supply lines of the semiconductor integrated circuit of FIG. 1 will now be described. FIG. 10 is a block diagram showing the structure of power supply lines of a semiconductor integrated circuit of the ninth modification.

The semiconductor integrated circuit of FIG. 10 has first macro cell power supply lines such as 25A through 25F and second macro cell power supply lines such as 35A through 35F on the macro cell 10. The first macro cell power supply lines and the second macro cell power supply lines have an approximately square shape. The first macro cell power supply lines supply a VDD potential to the macro cell 10 and the second macro cell power supply lines supply a VSS potential to the macro cell 10. The first macro cell power supply lines such as 25A through 25F and the second macro cell power supply lines such as 35A through 35F are formed in a fourth wiring layer that is the uppermost wiring layer used in the macro cell 10. The first macro cell power supply lines such as 25A through 25F and the second macro cell power supply lines such as 35A through 35F are arranged in a matrix.

In FIG. 10, the first upper layer power supply lines 50A, 50B and the second upper layer power supply lines 60A, 60B of FIG. 1 are arranged in the same manner as that of FIG. 1.

Note that the first macro cell power supply lines such as 25A through 25F and the second macro cell power supply lines such as 35A through 35F may have a rectangular shape.

(Tenth Modification)

Figure 11:
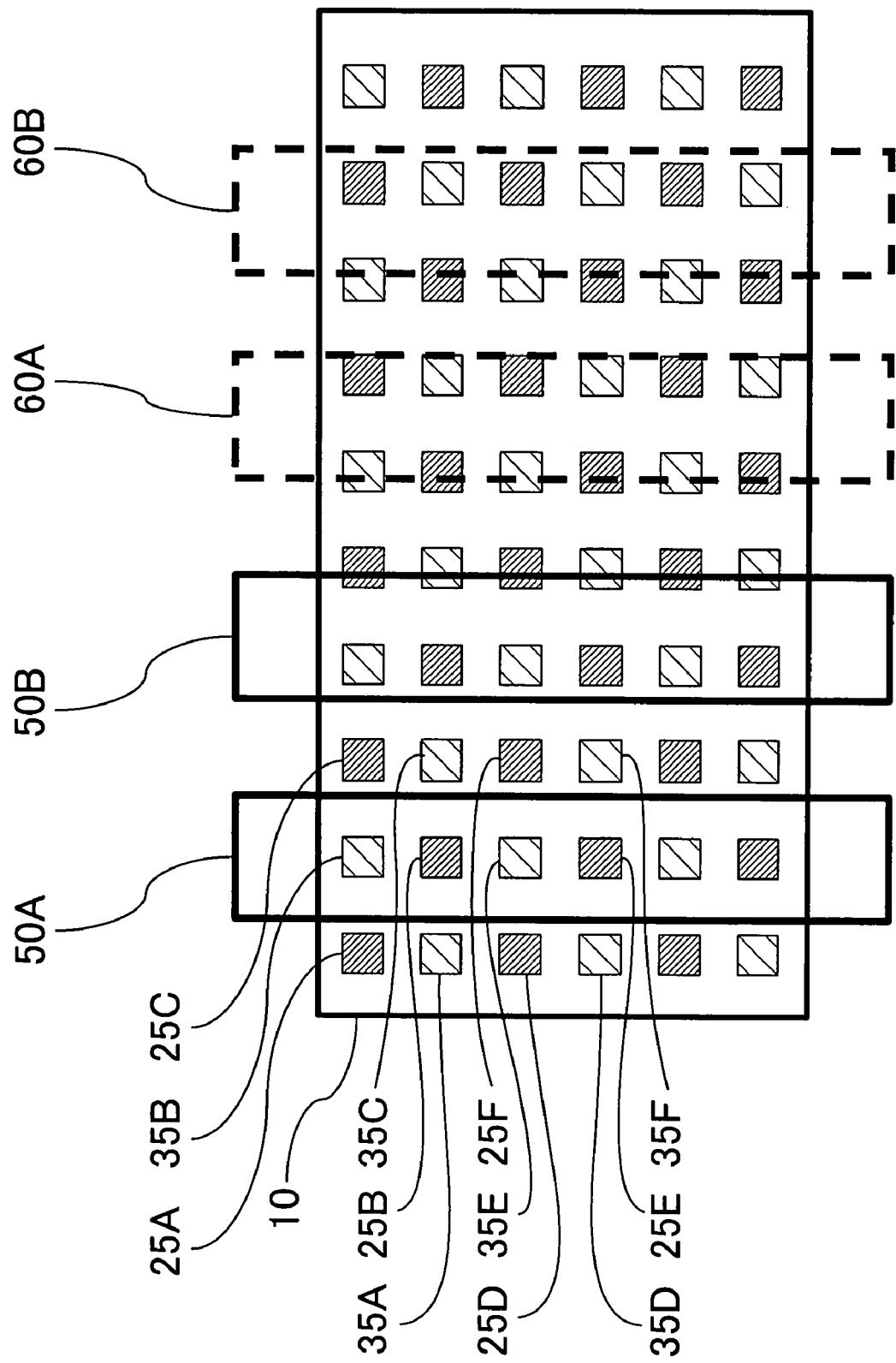
FIG. 11 is a block diagram showing the structure of power supply lines of a semiconductor integrated circuit according to a tenth modification of the invention.

A tenth modification of the power supply lines of the semiconductor integrated circuit of FIG. 1 will now be described. FIG. 11 is a block diagram showing the structure of power supply lines of a semiconductor integrated circuit of the tenth modification.

The semiconductor integrated circuit of FIG. 11 has the first macro cell power supply lines such as 25A through 25F of FIG. 10 and the second macro cell power supply lines such as 35A through 35F of FIG. 10. However, the structure of FIG. 11 is different from that of FIG. 10 in that the first macro cell power supply lines such as 25A through 25F and the second macro cell power supply lines such as 35A through 35F are arranged in a checkered pattern.

In FIG. 11, the first upper layer power supply lines 50A, 50B and the second upper layer power supply lines 60A, 60B of FIG. 1 are arranged in the same manner as that of FIG. 1.

(Eleventh Modification)

Figure 12:
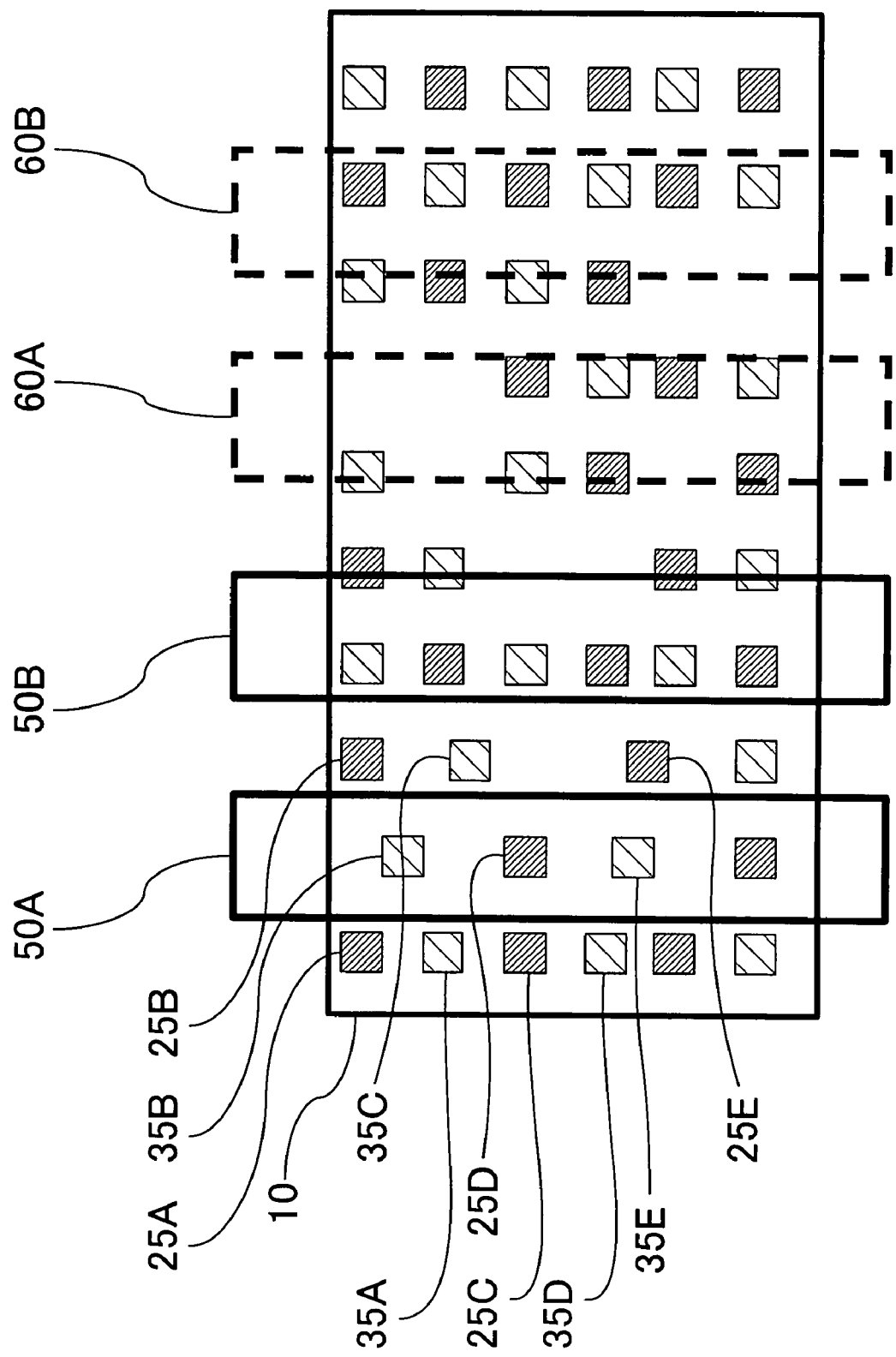
FIG. 12 is a block diagram showing the structure of power supply lines of a semiconductor integrated circuit according to an eleventh modification of the invention.

An eleventh modification of the power supply lines of the semiconductor integrated circuit of FIG. 1 will now be described. FIG. 12 is a block diagram showing the structure of power supply lines of a semiconductor integrated circuit of the eleventh modification.

The semiconductor integrated circuit of FIG. 12 has the first macro cell power supply lines such as 25A through 25E of FIG. 10 and the second macro cell power supply lines such as 35A through 35E of FIG. 10. However, the structure of FIG. 12 is different from that of FIG. 10 in that the first macro cell power supply lines such as 25A through 25E and the second macro cell power supply lines such as 35A through 35E are irregularly arranged.

In FIG. 12, the first upper layer power supply lines 50A, 50B and the second upper layer power supply lines 60A, 60B of FIG. 1 are arranged in the same manner as that of FIG. 1.

(Twelfth Modification)

Figure 13:
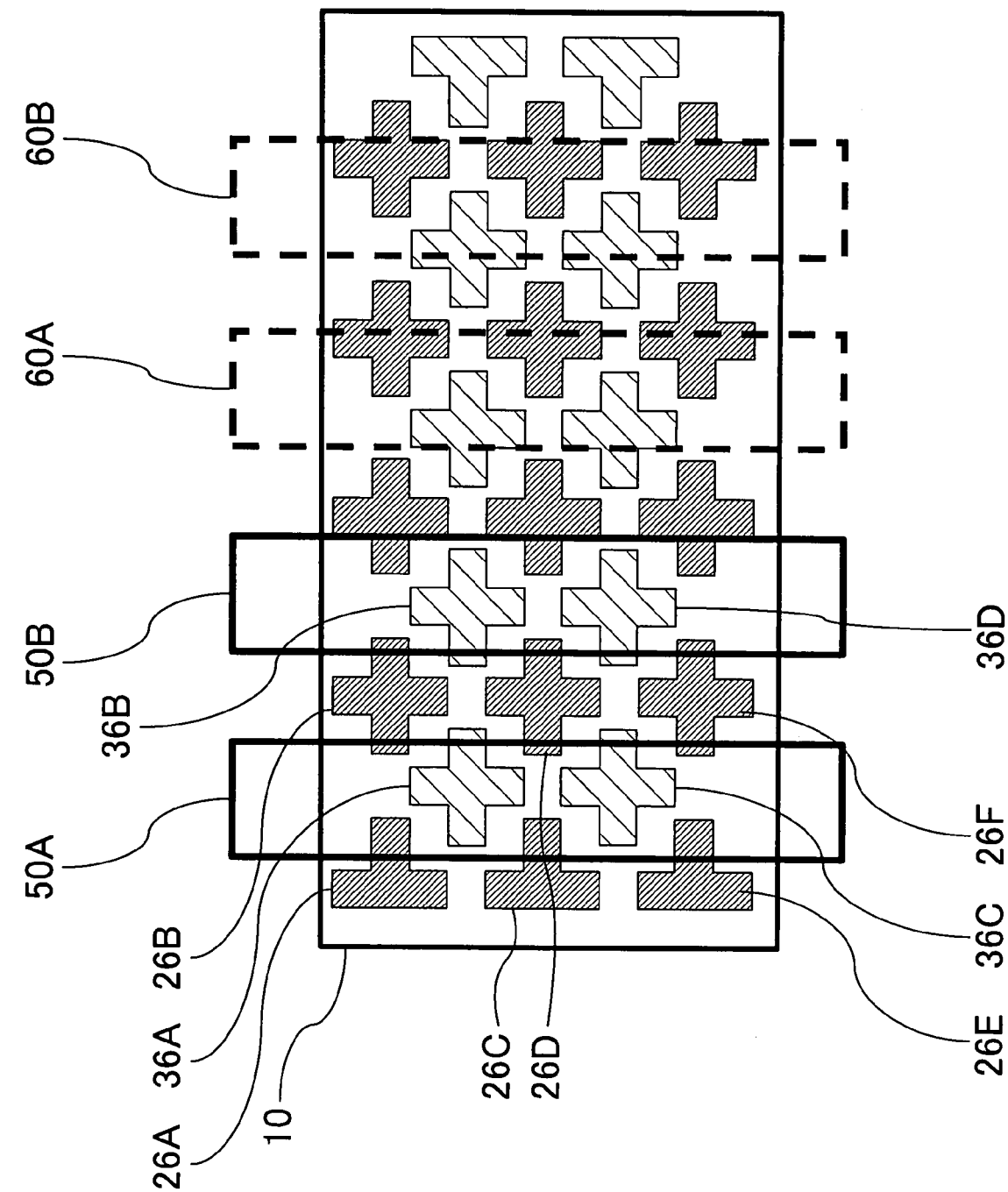
FIG. 13 is a block diagram showing the structure of power supply lines of a semiconductor integrated circuit according to a twelfth modification of the invention.

A twelfth modification of the power supply lines of the semiconductor integrated circuit of FIG. 1 will now be described. FIG. 13 is a block diagram showing the structure of power supply lines of a semiconductor integrated circuit of the twelfth modification.

The semiconductor integrated circuit of FIG. 13 has first macro cell power supply lines such as 26A through 26F and second macro cell power supply lines such as 36A through 36D on the macro cell 10. The first macro cell power supply lines and the second macro cell power supply lines protrude in a plurality of directions. The first macro cell power supply lines supply a VDD potential to the macro cell 10 and the second macro cell power supply lines supply a VSS potential to the macro cell 10. The first macro cell power supply lines such as 26A through 26F and the second macro cell power supply lines such as 36A through 36D are formed in a fourth wiring layer that is the uppermost wiring layer used in the macro cell 10.

The first macro cell power supply lines such as 26A through 26F are arranged in a matrix. The second macro cell power supply line 36A is located in the center of a region surrounded by the first macro cell power supply lines 26A, 26B, 26C, and 26D. Similarly, the second macro cell power supply line 36C is located in the center of a region surrounded by the first macro cell power supply lines 26C, 26D, 26E, and 26F. The second macro cell power supply lines such as 36A through 36D are thus also arranged in a matrix.

In FIG. 13, the first upper layer power supply lines 50A, 50B and the second upper layer power supply lines 60A, 60B of FIG. 1 are arranged in the same manner as that of FIG. 1.

(Thirteenth Modification)

Figure 14:
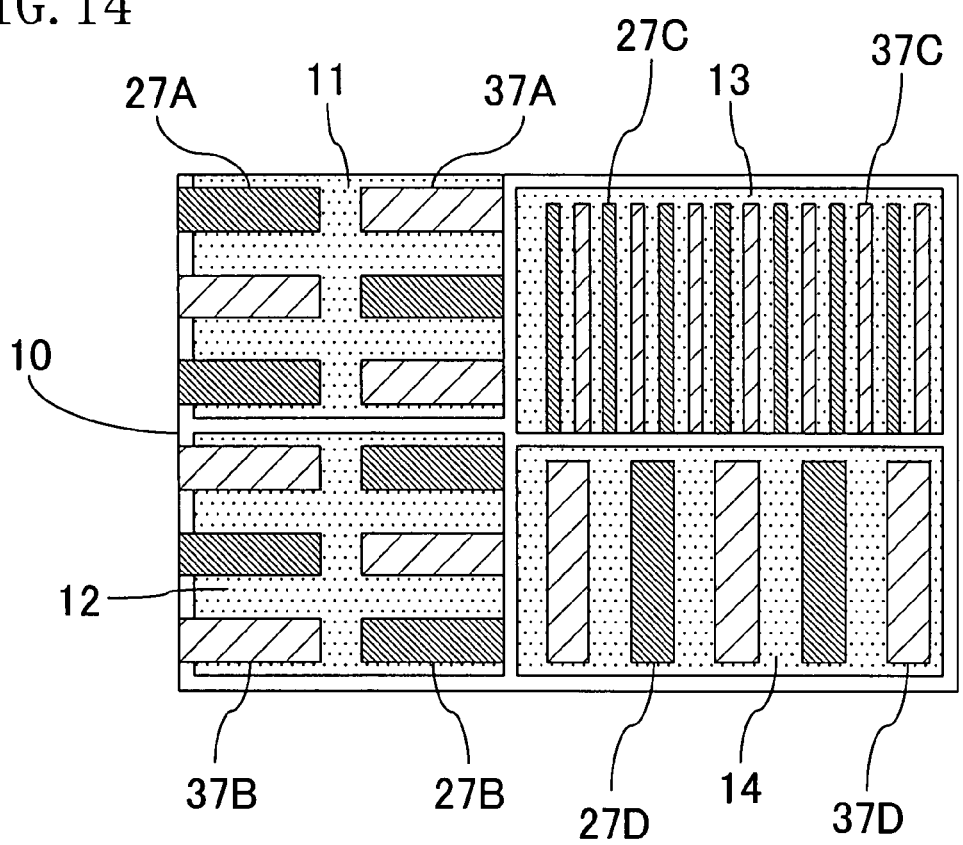
FIG. 14 is a block diagram showing the structure of power supply lines of a semiconductor integrated circuit according to a thirteenth modification of the invention.

A thirteenth modification of the power supply lines of the semiconductor integrated circuit of FIG. 1 will now be described. FIG. 14 is a block diagram showing the structure of power supply lines of a semiconductor integrated circuit of the thirteenth modification.

The semiconductor integrated circuit of FIG. 14 has first macro cell power supply lines such as 27A through 27D and second macro cell power supply lines such as 37A through 37D on the macro cell 10. The first macro cell power supply lines supply a VDD potential to the macro cell 10 and the second macro cell power supply lines supply a VSS potential to the macro cell 10. The first macro cell power supply lines such as 27A through 27D and the second macro cell power supply lines such as 37A through 37D are formed in a fourth wiring layer that is the uppermost wiring layer used in the macro cell 10.

The macro cell 10 has circuit blocks (function blocks) 11, 12, 13, and 14. The first macro cell power supply line 27A and the second macro cell power supply line 37A are provided on the circuit block 11. The first macro cell power supply line 27B and the second macro cell power supply line 37B are provided on the circuit block 12. The first macro cell power supply line 27C and the second macro cell power supply line 37C are provided on the circuit block 13. The first macro cell power supply line 27D and the second macro cell power supply line 37D are provided on the circuit block 14.

The wiring width, wiring pitch, or longitudinal direction of the first macro cell power supply lines such as 27A through 27D on each circuit block 11, 12, 13, 14 may be different from that on the other circuit blocks. The wiring width, wiring pitch, or longitudinal direction of the second macro cell power supply lines such as 37A through 37D on each circuit block 11, 12, 13, 14 may be different from that on the other circuit blocks.

Note that the circuit block 11, 12, 13, 14 may be a memory cell array region where a plurality of memory cells are arranged in a matrix. In the memory cell array region, the first macro cell power supply lines such as 27A through 27D and the second macro cell power supply lines such as 37A through 37D may be arranged at a wiring pitch that is equal to an integral multiple of the pitch of the memory cells or equal to the pitch of the memory cells. This facilitates layout design of the first macro cell power supply lines such as 27A through 27D and the second macro cell power supply lines such as 37A through 37D.

(Fourteenth Modification)

Figure 15:
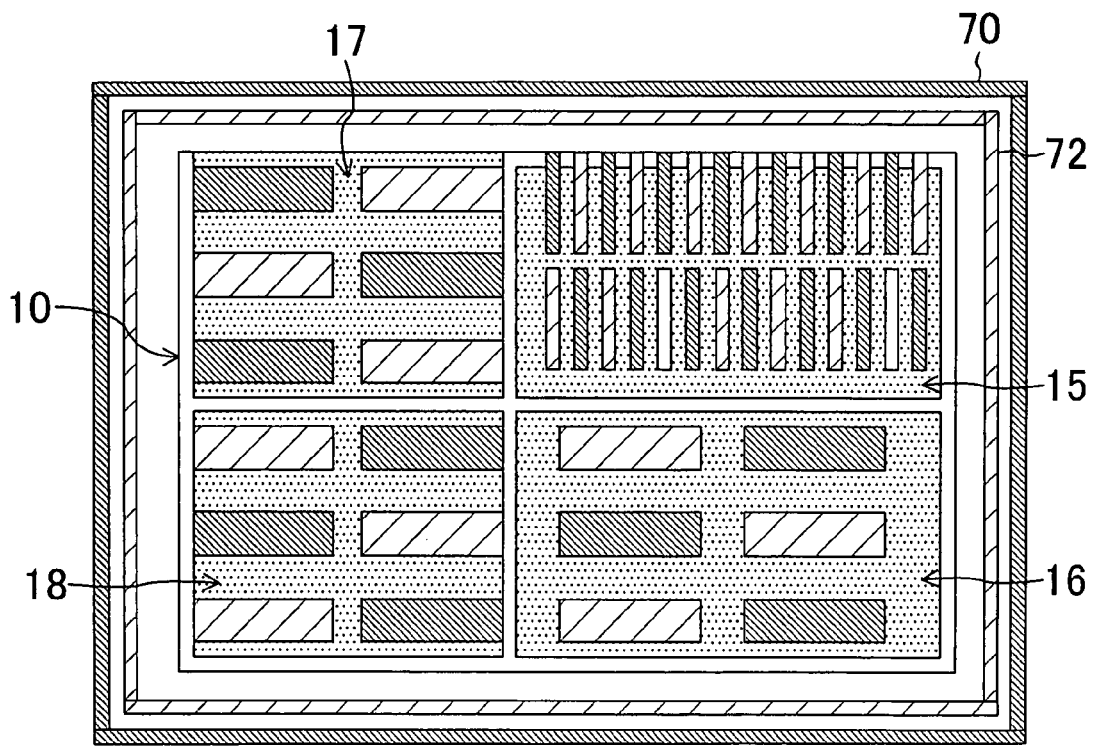
FIG. 15 is a block diagram showing the structure of power supply lines of a semiconductor integrated circuit according to a fourteenth modification of the invention.
Figure 16:
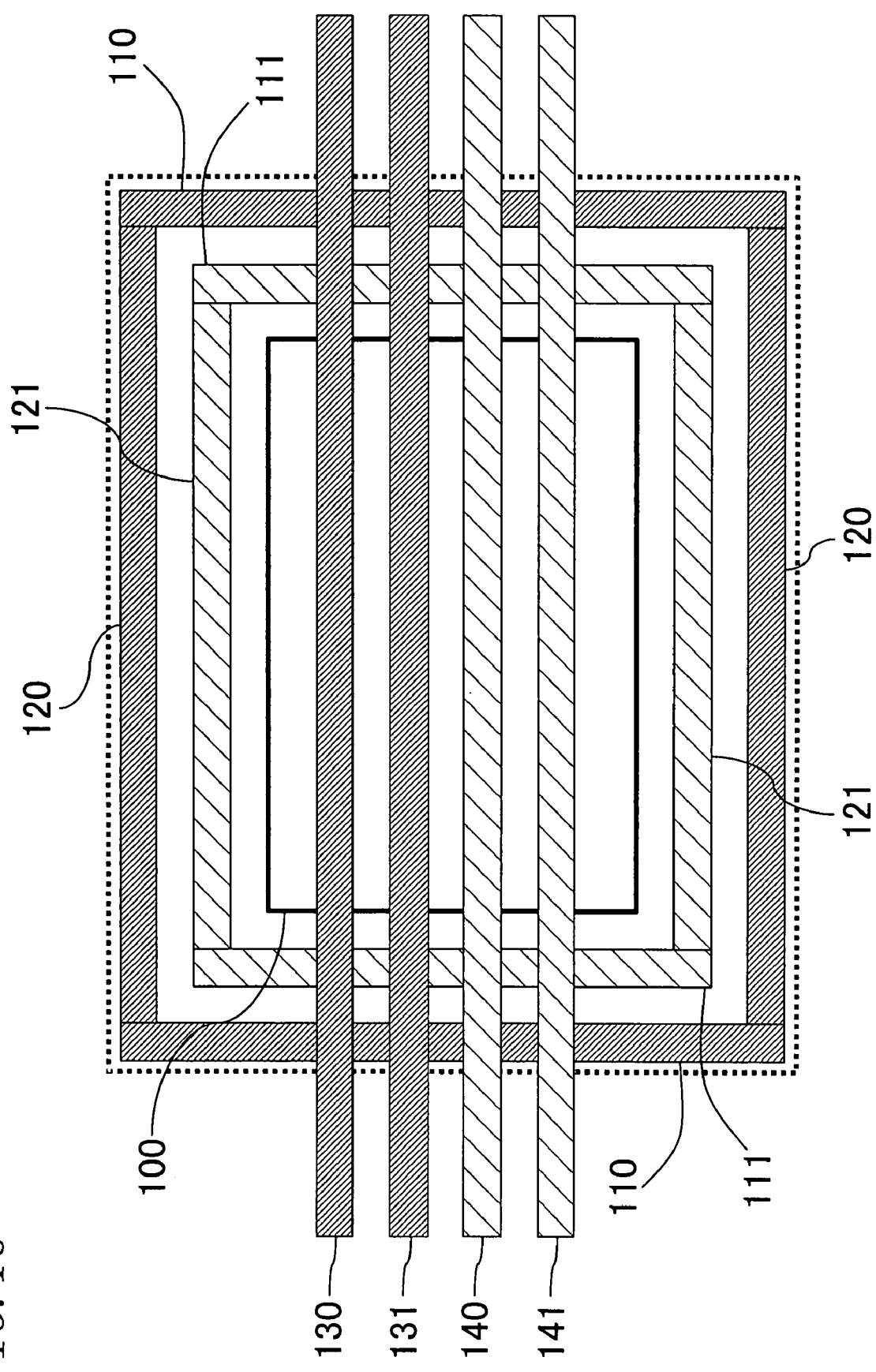
FIG. 16 is a block diagram showing the structure of power supply lines of a conventional semiconductor integrated circuit.

A fourteenth modification of the power supply lines of the semiconductor integrated circuit of FIG. 1 will now be described. FIG. 15 is a block diagram showing the structure of power supply lines of a semiconductor integrated circuit of the fourteenth modification.

In FIG. 15, the macro cell 10 of FIG. 1 has a memory cell array region 15 having a plurality of memory cells arranged in a matrix, and a peripheral circuit region for accessing data stored in the memory cells. The peripheral circuit region has an input/output (I/O) circuit region 16, a decoder circuit region 17, and a control circuit region 18.

The I/O circuit region 16 has an input/output (I/O) circuit for processing input and output of data to and from the memory cells. The decoder circuit region 17 has a decoder circuit for selecting a memory cell in the memory cell array region 15. The control circuit region 18 has a control circuit for controlling the I/O circuit and the decoder circuit.

The semiconductor integrated circuit of FIG. 15 has macro cell outer peripheral power supply lines 70, 72 in the outer periphery of the macro cell 10. The macro cell outer peripheral power supply line 70 supplies a VDD potential to the macro cell 10 and the macro cell outer peripheral power supply line 72 supplies a VSS potential to the macro cell 10.

The semiconductor integrated circuit of FIG. 15 further has a plurality of first macro cell power supply lines and a plurality of second macro cell power supply lines on the macro cell 10. The first macro cell power supply lines supply a VDD potential to the macro cell 10 and the second macro cell power supply lines supply a VSS potential to the macro cell 10.

The macro cell outer peripheral power supply line 70 has a pair of opposing portions for supplying a VDD potential to the macro cell 10. The macro cell outer peripheral power supply line 72 has a pair of opposing portions for supplying a VSS potential to the macro cell 10.

As described above, the semiconductor integrated circuit of FIG. 15 has the first and second macro cell power supply lines on the macro cell 10 in addition to the macro cell outer peripheral power supply lines 70, 72 located in the outer periphery of the macro cell 10. Therefore, the wiring width of the macro cell outer peripheral power supply lines 70, 72 can be made smaller than a wiring width corresponding to a current that is consumed in the macro cell 10.

Note that the semiconductor integrated circuits described with reference to FIGS. 1 through 15 may have a first macro cell internal power supply line for supplying a VDD potential to circuit elements in the macro cell 10 and a second macro cell internal power supply line for supplying a VSS potential to the circuit elements in the macro cell 10. In this case, the first and second macro cell internal power supply lines are formed in a wiring layer located between a wiring layer of the first and second macro cell power supply lines and a wiring layer of the circuit elements in the macro cell 10. The first macro cell internal power supply line extends in the direction perpendicular to the first macro cell power supply lines and is electrically connected to the first macro cell power supply lines. Similarly, the second macro cell internal power supply line extends in the direction perpendicular to the second macro cell power supply lines and is electrically connected to the second macro cell power supply lines. The semiconductor integrated circuit may have a plurality of first macro cell internal power supply lines and a plurality of second macro cell internal power supply lines.

The wiring width of the first macro cell internal power supply line may be smaller than that of the first macro cell power supply lines, and the wiring width of the second macro cell internal power supply line may be smaller than that of the second macro cell power supply lines.

The semiconductor integrated circuits described with reference to FIGS. 1 through 15 may further have a third macro cell power supply line for supplying to the macro cell 10 a potential different from the potentials supplied by the first and second macro cell power supply lines (e.g., a substrate potential). In addition to the third macro cell power supply line, the semiconductor integrated circuits may further have a macro cell power supply line for supplying to the macro cell 10 a potential different from the potentials supplied by the first and second macro cell power supply lines. The third macro cell power supply line may be provided in the outer periphery of the macro cell 10.

As has been described above, according to the invention, the power supply lines are provided on the macro cell and can be connected to the chip level power supply lines without securing a region for the power supply lines in the outer periphery of the macro cell. Therefore, the circuit area can be suppressed. The invention is thus useful for semiconductor integrated circuits and the like.

What is claimed is:

1. A semiconductor integrated circuit, comprising:
a macro cell having a plurality of circuit elements;
a first macro cell power supply line for supplying a first potential to the macro cell, the first macro cell power supply line having a longer side extending in a first direction, a shorter side shorter than the longer side, and two end portions; and
a second macro cell power supply line, formed in a same wiring layer as a wiring layer of the first macro cell power supply line, for supplying a second potential to the macro cell, the second macro cell power supply line having a longer side extending in the first direction, a shorter side shorter than the longer side of the second macro cell power supply line and two end portions, wherein:
the first and second macro cell power supply lines are provided on the macro cell, and
the first macro cell power supply line and the second macro cell power supply line are disposed on a same straight line in the first direction so that the two end portions of the first macro cell power supply line and two end portions of the second macro cell power supply line are disposed on the same straight line.

2. The semiconductor integrated circuit according to claim 1, comprising wherein:
the first macro cell power supply line comprises a plurality of the first macro cell power supply lines and the second macro cell power supply line comprises a plurality of the second macro cell power supply lines, and
each of the plurality of second macro cell power supply lines and corresponding one of the plurality of first macro cell power supply lines are disposed on a same straight line parallel to the first direction.

3. The semiconductor integrated circuit according to claim 2, wherein the plurality of first macro cell power supply lines are arranged next to each other in a second direction that is perpendicular to the first direction, and the plurality of second macro cell power supply lines are arranged next to each other in the second direction.

4. The semiconductor integrate circuit according to claim 3, wherein the plurality of first macro cell power supply lines are electrically connected together at their ends so as to form an integral, comb-shaped wiring, and the plurality of second macro cell power supply lines are electrically connected together at their ends so as to form an integral, comb-shaped wiring.

5. The semiconductor integrated circuit according to claim 3, wherein the plurality of first macro cell power supply lines and the plurality of second macro cell power supply lines have two different lengths.

6. The semiconductor integrated circuit according to claim 5, wherein the plurality of first macro cell power supply lines and the plurality of second macro cell power supply lines are provided so that the first macro cell power supply lines of two different lengths are arranged alternately and that the second macro cell power supply lines of two different lengths are arranged alternately.

7. The semiconductor integrated circuit according to claim 5, wherein each of the first macro cell power supply lines having a longer length is located next to one of the second macro cell power supply lines having a longer length, and each of the first macro cell power supply lines having a shorter length is located next to one of the second macro cell power supply lines having a shorter length.

8. The semiconductor integrated circuit according to claim 3, further comprising:
- a wiring formed in a same wiring layer as the wiring layer of the first macro cell power supply lines, separately formed from the plurality of first macro cell power supply lines, and extending in the second direction, for supplying the first potential to the macro cell; and
- a wiring formed in a same wiring layer as the wiring layer of the first macro cell power supply lines, separately formed from the plurality of second macro cell power supply lines, and extending in the second direction, for supplying the second potential to the macro cell.

9. The semiconductor integrated circuit according to claim 2, wherein at least one of the first macro cell power supply lines is located next to the second macro cell power supply lines in a second direction perpendicular to the first direction, and at least one of the second macro cell power supply lines is located next to the first macro cell power supply lines in the second direction.

10. The semiconductor integrated circuit according to claim 2, wherein
- the macro cell has a plurality of circuit blocks,
- a wiring width of the plurality of first macro cell power supply lines in one of the plurality of circuit blocks is different from a wiring width of the plurality of first macro cell power supply lines in another circuit block, and
- a wiring width of the plurality of second macro cell power supply lines in one of the plurality of circuit blocks is different from a wiring width of the plurality of second macro cell power supply lines in another circuit block.

11. The semiconductor integrated circuit according to claim 2, wherein
- the macro cell has a plurality of circuit blocks,
- a wiring pitch of the plurality of first macro cell power supply lines in one of the plurality of circuit blocks is different from a wiring pitch of the plurality of first macro cell power supply lines in another circuit block, and
- a wiring pitch of the plurality of second macro cell power supply lines in one of the plurality of circuit blocks is different from a wiring pitch of the plurality of second macro cell power supply lines in another circuit block.

12. The semiconductor integrated circuit according to claim 2, wherein
- the macro cell has a plurality of circuit blocks,
- an extending direction of the plurality of first macro cell power supply lines in one of the plurality of circuit blocks is different from an extending direction of first wiring lines disposed in another circuit block, the first wiring lines formed in a same wiring layer as the wiring layer of the first macro cell power supply lines, supplying the first potential to the macro cell, and separately formed from the plurality of first macro cell power supply lines, and
- an extending direction of the plurality of second macro cell power supply lines in one of the plurality of circuit blocks is different from an extending direction of second wiring lines disposed in another circuit block, the second wiring lines formed in a same wiring layer as the wiring layer of the second macro cell power supply lines, supplying the second potential to the macro cell, and separately formed from the plurality of second macro cell power supply lines.

13. The semiconductor integrated circuit according to claim 2, wherein
- the macro cell has a circuit block having the plurality of circuit elements arranged in a matrix, and
- on the circuit block, the plurality of first macro cell power supply lines and the plurality of second macro cell power supply lines are arranged at a wiring pitch that is an integral multiple of a pitch of the circuit elements.

14. The semiconductor integrated circuit according to claim 1, wherein:
- the first macro cell power supply line comprises a plurality of the first macro cell power supply lines and the second macro cell power supply line comprises a plurality of the second macro cell power supply lines,
- the plurality of first macro cell power supply lines are arranged next to each other in a second direction perpendicular to the first direction and are electrically connected together at their ends so as to form an integral, comb-shaped wiring, and
- the plurality of second macro cell power supply lines are arranged next to each other in the second direction and are electrically connected together at their ends so as to form an integral, comb-shaped wiring.

15. The semiconductor integrated circuit according to claim 1, wherein the first macro cell power supply line supplies the first potential to the plurality of circuit elements, and the second macro cell power supply line supplies the second potential to the plurality of circuit elements.

16. The semiconductor integrated circuit according to claim 1, further comprising:
- a first upper layer power supply line formed in a layer located higher than the wiring layer of the first macro cell power supply line, for supplying the first potential to the first macro cell power supply line, and
- a second upper layer power supply line formed in a layer located higher than the wiring layer of the second macro cell power supply line, for supplying the second potential to the second macro cell power supply line.

17. The semiconductor integrated circuit according to claim 16, wherein the first upper layer power supply line and the second upper layer power supply line are formed in a same layer.

18. The semiconductor integrated circuit according to claim 16, wherein the first upper layer power supply line extends in parallel with the first macro cell power supply line, and the second upper layer power supply line extends in parallel with the second macro cell power supply line.

19. The semiconductor integrated circuit according to claim 16, wherein the first upper layer power supply line extends in a direction perpendicular to the first macro cell power supply line, and the second upper layer power supply line extends in a direction perpendicular to the second macro cell power supply line.

20. The semiconductor integrated circuit according to claim 16, wherein:
- the first macro cell power supply line comprises a plurality of the first macro cell power supply lines and the second macro cell power supply line comprises a plurality of the second macro cell power supply lines, and
- the first upper layer power supply line has a wiring width that is larger than a wiring pitch of the first macro cell power supply lines, and the second upper layer power supply line has a wiring width that is larger than a wiring pitch of the second macro cell power supply lines.

21. The semiconductor integrated circuit according to claim 1, wherein the macro cell includes a memory cell array region having a plurality of memory cells arranged in a matrix and a peripheral circuit region having a circuit for accessing data stored in the plurality of memory cells.

22. The semiconductor integrated circuit according to claim 21, wherein the peripheral circuit region has an input/output (I/O) circuit for processing input and output of data to and from the plurality of memory cells, a decoder circuit for selecting a memory cell to be accessed from the plurality of memory cells, and a control circuit for controlling the I/O circuit and the decoder circuit.

23. The semiconductor integrated circuit according to claim 21, further comprising:
a first macro cell outer peripheral power supply line for supplying the first potential to the macro cell; and
a second macro cell outer peripheral power supply line for supplying the second potential to the macro cell, wherein
the first macro cell outer peripheral power supply line is provided in an outer periphery of the macro cell and has at least a pair of opposing portions, and
the second macro cell outer peripheral power supply line is provided in an outer periphery of the macro cell and has at least a pair of opposing portions.

24. The semiconductor integrated circuit according to claim 1, further comprising:
a first macro cell internal power supply line electrically connected to the first macro cell power supply line, for supplying the first potential to the circuit elements; and
a second macro cell internal power supply line electrically connected to the second macro cell power supply line, for supplying the second potential to the circuit elements, wherein
the first macro cell internal power supply line is formed in a layer located between the wiring layer of the first macro cell power supply line and a layer of the circuit elements and extends in a direction perpendicular to the first macro cell power supply line, and
the second macro cell internal power supply line is formed in a layer located between the wiring layer of the second macro cell power supply line and the layer of the circuit elements and extends in a direction perpendicular to the second macro cell power supply line.

25. The semiconductor integrated circuit according to claim 24, wherein the first macro cell internal power supply line has a wiring width that is smaller than a wiring width of the first macro cell power supply line, and the second macro cell internal power supply line has a wiring width that is smaller than a wiring width of the second macro cell power supply line.

26. The semiconductor integrated circuit according to claim 1, further comprising a third macro cell power supply line for supplying a potential that is different from the potentials of the first and second macro cell power supply lines to the macro cell.

27. The semiconductor integrated circuit according to claim 26, wherein the third macro cell power supply line is provided in an outer periphery of the macro cell.

28. The semiconductor integrated circuit according to claim 26, wherein the third macro cell power supply line supplies a substrate potential to the macro cell.

29. A semiconductor integrated circuit, comprising:
a macro cell having a plurality of circuit elements;
a plurality of first macro cell power supply lines for supplying a first potential to the macro cell; and
a plurality of second macro cell power supply lines formed in a same wiring layer as a wiring layer of the first macro cell power supply line, for supplying a second potential to the macro cell, wherein:
the first and second macro cell power supply lines are provided on the macro cell, and the plurality of first macro cell power supply lines have an approximately square shape and are arranged approximately in a matrix, and the plurality of second macro cell power supply lines have an approximately square shape and are arranged approximately in a matrix.

30. The semiconductor integrated circuit according to claim 29, wherein the first macro cell power supply lines and the second macro cell power supply lines are arranged in a checkered pattern.

31. A semiconductor integrated circuit, comprising:
a macro cell having a plurality of circuit elements;
a plurality of first macro cell power supply lines for supplying a first potential to the macro cell; and
a plurality of second macro cell power supply lines formed in a same wiring layer as a wiring layer of the first macro cell power supply line, for supplying a second potential to the macro cell, wherein:
the first and second macro cell power supply lines are provided on the macro cell, and
the plurality of first macro cell power supply lines have protruding portions protruding at least three directions and are arranged approximately in a matrix, and the plurality of second macro cell power supply lines have protruding portions protruding at least three directions and are arranged approximately in a matrix.

* * * * *